US009748185B2

(12) United States Patent
Viswanathan et al.

(10) Patent No.: US 9,748,185 B2
(45) Date of Patent: Aug. 29, 2017

(54) SEMICONDUCTOR DEVICES WITH IMPEDANCE MATCHING-CIRCUITS

(71) Applicant: Freescale Semiconductor, Inc., Austin, TX (US)

(72) Inventors: Lakshminarayan Viswanathan, Phoenix, AZ (US); Jeffrey K. Jones, Chandler, AZ (US); Scott D. Marshall, Chandler, AZ (US)

(73) Assignee: NXP USA, INC., Austin, TX (US)

( * ) Notice: Subject to any disclaimer, the term of this patent is extended or adjusted under 35 U.S.C. 154(b) by 0 days.

(21) Appl. No.: 15/050,176

(22) Filed: Feb. 22, 2016

(65) Prior Publication Data
US 2016/0172318 A1 Jun. 16, 2016

Related U.S. Application Data

(62) Division of application No. 13/611,793, filed on Sep. 12, 2012, now Pat. No. 9,281,283.

(51) Int. Cl.
H01L 27/108 (2006.01)
H01L 29/94 (2006.01)
(Continued)

(52) U.S. Cl.
CPC ............ *H01L 23/66* (2013.01); *H01L 23/047* (2013.01); *H01L 23/49589* (2013.01);
(Continued)

(58) Field of Classification Search
CPC . H01L 23/66; H01L 23/047; H01L 23/49589; H01L 28/10; H01L 23/5227; H01L 23/645; H01L 23/647
See application file for complete search history.

(56) References Cited

U.S. PATENT DOCUMENTS 3,434,070 A 3/1969 Bartnik et al.
3,908,105 A * 9/1975 Schuler ................. H01H 35/24
200/61.25
(Continued)

FOREIGN PATENT DOCUMENTS

CN 101296347 A 10/2008
CN 102340288 A 2/2012
(Continued)

OTHER PUBLICATIONS

Kahn, "Multilayer Ceramic Capacitors—Materials and Manufacture", Technical Information, AVX, Sep. 5, 2000, 3 pages.
(Continued)

*Primary Examiner* — Benjamin Sandvik
*Assistant Examiner* — Damon Hillman
(74) *Attorney, Agent, or Firm* — Sherry W. Schumm

(57) ABSTRACT

Embodiments of semiconductor devices (e.g., RF devices) include a substrate, an isolation structure, an active device, a lead, and a circuit. The isolation structure is coupled to the substrate, and includes an opening. An active device area is defined by a portion of the substrate surface that is exposed through the opening. The active device is coupled to the substrate surface within the active device area. The circuit is electrically coupled between the active device and the lead. The circuit includes one or more elements positioned outside the active device area (e.g., physically coupled to the isolation structure and/or under the lead). The elements positioned outside the active device area may include elements of an envelope termination circuit and/or an impedance matching circuit. Embodiments also include method of manufacturing such semiconductor devices.

16 Claims, 10 Drawing Sheets

(51) Int. Cl.
   *H01L 31/119* (2006.01)
   *H01L 23/66* (2006.01)
   *H01L 23/047* (2006.01)
   *H01L 23/00* (2006.01)
   *H01L 23/495* (2006.01)

(52) U.S. Cl.
   CPC ............. *H01L 24/49* (2013.01); *H01L 24/48* (2013.01); *H01L 2223/6611* (2013.01); *H01L 2223/6655* (2013.01); *H01L 2223/6672* (2013.01); *H01L 2224/48091* (2013.01); *H01L 2224/48137* (2013.01); *H01L 2224/48247* (2013.01); *H01L 2224/49052* (2013.01); *H01L 2224/49175* (2013.01); *H01L 2924/00014* (2013.01); *H01L 2924/1305* (2013.01); *H01L 2924/1306* (2013.01); *H01L 2924/13091* (2013.01); *H01L 2924/16152* (2013.01); *H01L 2924/181* (2013.01); *H01L 2924/3011* (2013.01); *H01L 2924/30111* (2013.01)

(56) References Cited

U.S. PATENT DOCUMENTS

| | | | |
|---|---|---|---|
| 3,908,185 A * | 9/1975 | Martin | H01L 23/66 257/664 |
| 4,717,884 A | 1/1988 | Mitzlaff | |
| 5,066,925 A | 11/1991 | Freitag | |
| 5,625,528 A | 4/1997 | Devoe et al. | |
| 5,736,901 A | 4/1998 | Nakamura | |
| 5,808,527 A | 9/1998 | De Los Santos | |
| 6,072,211 A * | 6/2000 | Miller | H01L 23/642 257/308 |
| 6,072,238 A | 6/2000 | Viswanathan et al. | |
| 6,072,690 A | 6/2000 | Farooq et al. | |
| 6,081,160 A | 6/2000 | Custer et al. | |
| 6,222,425 B1 * | 4/2001 | Okada | H01P 1/387 333/1.1 |
| 6,507,101 B1 | 1/2003 | Morris | |
| 6,731,174 B2 | 5/2004 | Krvavac | |
| 6,822,321 B2 | 11/2004 | Crescenzi | |
| 7,029,971 B2 | 4/2006 | Borland | |
| 7,057,464 B2 | 6/2006 | Bharj | |
| 7,135,643 B2 | 11/2006 | Van Haaster et al. | |
| 7,368,668 B2 | 5/2008 | Ren et al. | |
| 7,372,334 B2 | 5/2008 | Blair et al. | |
| 7,412,007 B1 | 8/2008 | Richley et al. | |
| 7,564,303 B2 | 7/2009 | Perugupalli et al. | |
| 7,733,059 B2 | 6/2010 | Yoshida | |
| 8,030,763 B2 | 10/2011 | Romero et al. | |
| 8,253,495 B2 | 8/2012 | Bouisse | |
| 8,324,728 B2 * | 12/2012 | Tabrizi | H01L 23/055 257/704 |
| 8,350,367 B2 | 1/2013 | Chiu et al. | |
| 8,611,459 B2 | 12/2013 | McCallister | |
| 8,659,359 B2 | 2/2014 | Ladhani et al. | |
| 9,106,187 B2 | 8/2015 | Ladhani et al. | |
| 9,190,965 B2 | 11/2015 | Ladhani et al. | |
| 2005/0083723 A1 | 4/2005 | Blednov et al. | |
| 2007/0024358 A1 | 2/2007 | Perugupalli et al. | |
| 2007/0029665 A1 | 2/2007 | Lee et al. | |
| 2007/0090515 A1 | 4/2007 | Condie et al. | |
| 2007/0158787 A1 | 7/2007 | Chanchani | |
| 2007/0273449 A1 | 11/2007 | Wilson | |
| 2008/0231373 A1 | 9/2008 | Rahman et al. | |
| 2008/0246547 A1 * | 10/2008 | Blednov | H01L 23/66 331/109 |
| 2009/0130544 A1 | 5/2009 | Chang et al. | |
| 2010/0038111 A1 | 2/2010 | Yabe et al. | |
| 2011/0031571 A1 | 2/2011 | Bouisse | |
| 2011/0156203 A1 | 6/2011 | Park | |
| 2012/0019334 A1 | 1/2012 | Hirai et al. | |
| 2012/0146723 A1 | 6/2012 | Blednov et al. | |
| 2012/0154053 A1 | 6/2012 | Blair | |
| 2013/0033325 A1 | 2/2013 | Ladhani et al. | |
| 2014/0022020 A1 | 1/2014 | Aaen et al. | |
| 2014/0070365 A1 | 3/2014 | Viswanathan et al. | |
| 2014/0077881 A1 | 3/2014 | Wilson | |
| 2014/0167855 A1 | 6/2014 | Ladhani et al. | |
| 2014/0167863 A1 | 6/2014 | Ladhani et al. | |
| 2014/0179243 A1 | 6/2014 | Bouisse et al. | |
| 2014/0225672 A1 | 8/2014 | Wilson et al. | |
| 2014/0333385 A1 | 11/2014 | Gutta et al. | |
| 2015/0115893 A1 | 4/2015 | Lee et al. | |
| 2015/0235933 A1 | 8/2015 | Ladhani et al. | |
| 2015/0263681 A1 | 9/2015 | Embar et al. | |

FOREIGN PATENT DOCUMENTS

| | | |
|---|---|---|
| JP | 2007-285875 A | 11/2007 |
| JP | 2008-175804 A | 7/2008 |
| WO | 0182672 A1 | 11/2001 |
| WO | 2009130544 A1 | 10/2009 |
| WO | 2010038111 A1 | 4/2010 |

OTHER PUBLICATIONS

Notice of Allowance mailed May 29, 2015 for U.S. Appl. No. 14/185,382, 5 pages.
Non-Final Office Action mailed Jul. 7, 2014 for U.S. Appl. No. 14/185,291, 15 pages.
Notice of Allowance mailed Mar. 5, 2015 for U.S. Appl. No. 14/185,291, 7 pages.
Notice of Allowance mailed Oct. 29, 2014 for U.S. Appl. No. 14/185,291, 6 pages.
Non-Final Office Action mailed Aug. 11, 2014 for U.S. Appl. No. 14/185,382, 12 pages.
Non-Final Office Action mailed Dec. 29, 2014 for U.S. Appl. No. 14/185,382, 9 pages.
Non-Final Office Action mailed Nov. 2, 2015 for U.S. Appl. No. 14/317,572, 10 pages.
U.S. Appl. No. 12/746,793, Lad Han I, et al., "RF Power Transistor Circuit", filed Jun. 8, 2010.
Notice of Allowance dated May 6, 2016 for U.S. Appl. No. 14/317,572 9 pages.
Non-Final Office Action dated Apr. 11, 2016 for U.S. Appl. No. 14/942,419 11 pages.
Notice of Allowance dated Nov. 9, 2016 for U.S. Appl. No. 14/942,419 12 pages.
Notice of Allowance dated Mar. 6, 2017 for U.S. Appl. No. 14/942,419 5 pages.
Non-Final Office Action dated Nov. 2, 2016 for U.S. Appl. No. 14/919,511 5 pages.
Notice of Allowance dated Feb. 27, 2017 for U.S. Appl. No. 14/919,511 7 pages.
Notice of Allowance dated Nov. 2, 2016 for U.S. Appl. No. 14/919,513 7 pages.
Notice of Allowance dated Apr. 21, 2017 for U.S. Appl. No. 14/942,419 11 pages.
Notice of Allowance dated May 15, 2017 for U.S. Appl. No. 14/919,511 5 pages.

* cited by examiner

SEMICONDUCTOR DEVICES WITH IMPEDANCE MATCHING-CIRCUITS

RELATED APPLICATION

This application is a divisional of co-pending, U.S. patent application Ser. No. 13/611,793, filed on Sep. 12, 2012.

TECHNICAL FIELD

Embodiments of the subject matter described herein relate generally to packaged semiconductor devices, and more particularly to packaged, radio frequency (RF) semiconductor devices that include impedance matching circuits.

BACKGROUND

A typical high power, radio frequency (RF) semiconductor device may include one or more input leads, one or more output leads, one or more transistors, bondwires coupling the input lead(s) to the transistor(s), and bondwires coupling the transistor(s) to the output lead(s). The bondwires have significant inductances at high frequencies, and such inductances may be factored into the design of input and output impedance matching circuits for a device. In some cases, input and output impedance matching circuits may be contained within the same package that contains the device's transistor(s). More specifically, an in-package, input impedance matching circuit may be coupled between a device's input lead and a control terminal (e.g., the gate) of a transistor, and an in-package, output impedance matching circuit may be coupled between a current conducting terminal (e.g., the drain) of a transistor and a device's output lead. Each of the input and output impedance matching circuits may include one or more capacitive and resistive elements, along with the inductances inherent in the sets of bondwires interconnecting those elements with the device's transistor(s) and with the input and output leads.

Such packaged RF semiconductor devices are readily available, which have very good performance when used in narrow-band applications. However, designing suitable packaged RF semiconductor devices for wideband, multi-band, and/or multi-mode operation is challenging for several reasons. For example, in a packaged RF semiconductor device, the lead level output impedance is limited by the number of matching sections. Therefore, to achieve an acceptable lead level output impedance for a wideband, multi-band, and/or multi-mode application, it may be desirable to incorporate multiple, in-package matching sections. However, the inclusion of multiple matching sections in a device increases the number of impedance matching elements in the impedance matching circuits, and thus increases the size of the device. In addition, the various sets of bondwires that would be implemented to interconnect the impedance matching elements for multi-stage matching may create unacceptable inductive coupling between the matching sections, which may limit the effectiveness of the impedance transformation. In addition, to facilitate good performance for wideband, multi-band, and/or multi-mode implementations, relatively large discrete capacitors in the impedance matching circuits may be warranted. Accordingly, in order to accommodate the relatively large capacitors, package sizes for such implementations would need to be further increased. Increasing semiconductor device package size is incompatible with the industry trend to reduce device sizes and costs.

BRIEF DESCRIPTION OF THE DRAWINGS

A more complete understanding of the subject matter may be derived by referring to the detailed description and claims when considered in conjunction with the following figures, wherein like reference numbers refer to similar elements throughout the figures.

DETAILED DESCRIPTION

The following detailed description is merely illustrative in nature and is not intended to limit the embodiments of the subject matter or the application and uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

Embodiments include semiconductor devices (e.g., radio frequency (RF) semiconductor devices) implemented using air cavity and overmolded packages. As will be discussed in more detail below, an embodiment of a semiconductor device includes an active device (e.g., a transistor) generally located within an "active device area" of a package, an input impedance matching circuit coupled to an input to the device, and an output impedance matching circuit coupled to the output of the device. Each of the input and output impedance matching circuits includes a plurality of impedance matching elements (e.g., inductors and capacitors). According to various embodiments, certain ones of the impedance matching elements are located outside of the active device area of the package, while still achieving the desired electrical characteristics of the input and output impedance matching circuits. In the description, below, embodiments of various types of packages (e.g., air cavity packages and overmolded packages) are discussed in detail. More specifically, in various embodiments, one or more impedance matching elements are physically coupled to an isolation structure of the device, as will be described in more detail below. In particular, air cavity package embodiments are discussed first (in conjunction with FIGS. 2-10), and overmolded package embodiments are discussed thereafter (in conjunction with FIG. 11). It is to be understood that features discussed with respect to one type of package may also be implemented in the other type of package, and the scope of the inventive subject matter includes such modifications. In addition, although the description herein primarily discusses positioning impedance matching elements of an output impedance matching circuit outside of the active portion of a package, it is to be understood that impedance matching elements of an input impedance matching circuit similarly may be positioned outside of the active portion of a package, in other embodiments.

Figure 1:
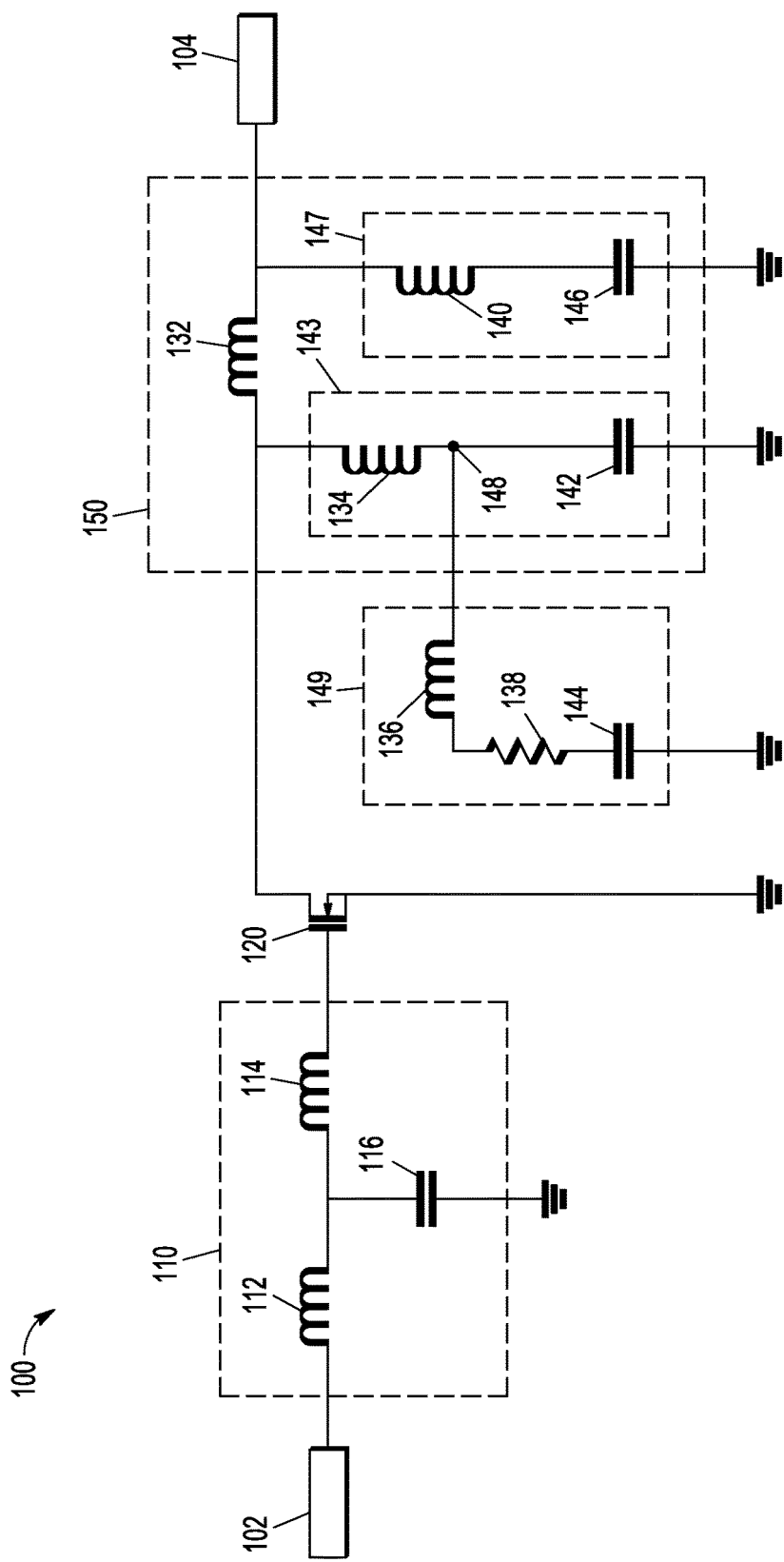
FIG. 1 is a schematic diagram of a semiconductor device with input and output impedance matching circuits, in accordance with an example embodiment.

FIG. 1 is a schematic diagram of a semiconductor device 100, in accordance with an example embodiment. Device 100 includes an input lead 102, an input impedance matching circuit 110, a transistor 120, an envelope frequency termination circuit 149, an output impedance matching circuit 150, and an output lead 104, in an embodiment. The envelope frequency termination circuit 149 and the output impedance matching circuit 150 may be referred to collectively as an "output circuit." Although transistor 120 and various elements of the input and output impedance matching circuits 110, 150 are shown as singular components, the depiction is for the purpose of ease of explanation only. Those of skill in the art would understand, based on the description herein, that transistor 120 and/or certain elements of the input and output impedance matching circuits 110, 150 each may be implemented as multiple components (e.g., connected in parallel or serial with each other), and examples of such embodiments are illustrated in the other figures and described later. For example, embodiments may include single-path devices (e.g., including a single input lead, output lead, transistor, etc.), dual-path devices (e.g., including two input leads, output leads, transistors, etc.), and/or multi-path devices (e.g., including two or more input leads, output leads, transistors, etc.). Further, the number of input/output leads may not be the same as the number of transistors (e.g., there may be multiple transistors operating in parallel for a given set of input/output leads). The description of transistor 120 and various elements of the input and output impedance matching circuits, below, thus are not intended to limit the scope of the inventive subject matter only to the illustrated embodiments.

Input lead 102 and output lead 104 each include a conductor, which is configured to enable the device 100 to be electrically coupled with external circuitry (not shown). More specifically, input and output leads 102, 104 are physically located between the exterior and the interior of the device's package. Input impedance matching circuit 110 is electrically coupled between the input lead 102 and a first terminal of transistor 120, which is also located within the device's interior, and output impedance matching circuit 120 is electrically coupled between a second terminal of transistor 120 and the output lead 104.

According to an embodiment, transistor 120 is the primary active component of device 100. Transistor 120 includes a control terminal and two current conducting terminals, where the current conducting terminals are spatially and electrically separated by a variable-conductivity channel. For example, transistor 120 may be a field effect transistor (FET) (such as a metal oxide semiconductor FET (MOSFET)), which includes a gate (control terminal), a drain (a first current conducting terminal), and a source (a second current conducting terminal). Alternatively, transistor 120 may be a bipolar junction transistor (BJT). Accordingly, references herein to a "gate," "drain," and "source," are not intended to be limiting, as each of these designations has analogous features for a BJT implementation (e.g., a base, collector, and emitter, respectively). According to an embodiment, and using nomenclature typically applied to MOSFETs in a non-limiting manner, the gate of transistor 120 is coupled to the input impedance matching circuit 110, the drain of transistor 120 is coupled to the output impedance matching circuit 150, and the source of transistor 120 is coupled to ground. Through the variation of control signals provided to the gate of transistor 120, the current between the current conducting terminals of transistor 120 may be modulated.

Input impedance matching circuit 110 is configured to raise the impedance of device 100 to a higher (e.g., intermediate or higher) impedance level (e.g., in a range from about 2 to about 10 Ohms or higher). This is advantageous in that it allows the PCB-level matching interface from a driver stage to have an impedance that can be achieved in high-volume manufacturing with minimal loss and variation (e.g., a "user friendly" matching interface). Input impedance matching circuit 110 is coupled between the input lead 202 and the control terminal (e.g., gate) of the transistor 120. According to an embodiment, input impedance matching circuit 110 includes two inductive elements 112 (e.g., two sets of bondwires), 116 and a shunt capacitor 114. A first inductive element 112 (e.g., a first set of bondwires) is coupled between input lead 102 and a first terminal of capacitor 114, and a second inductive element 116 (e.g., a second set of bondwires) is coupled between the first terminal of capacitor 114 and the control terminal of transistor 120. The second terminal of capacitor 114 is coupled to ground. The combination of inductive elements 112, 116 and shunt capacitor 114 functions as a low-pass filter. According to an embodiment, the series combination of inductive elements 112, 116 may have a value in a range between about 50 picohenries (pH) to about 3 nanohenries (nH), and shunt capacitor 114 may have a value in a range between about 5 picofarads (pF) to about 80 pF.

Output impedance matching circuit 150 is configured to match the output impedance of device 100 with the input impedance of an external circuit or component (not shown) that may be coupled to output lead 104. Output impedance matching circuit 150 is coupled between the first current conducting terminal (e.g., drain) of transistor 120 and the output lead 104. According to an embodiment, output impedance matching circuit 150 includes three inductive elements 132, 134, 140 (e.g., three sets of bondwires) and two capacitors 142, 146. A first inductive element 132 (e.g., a third set of bondwires), which may be referred to herein as a "series inductor," is coupled between the first current conducting terminal (e.g., drain) of transistor 120 and the output lead 104. A second inductive element 134 (e.g., a fourth set of bondwires), which may be referred to herein as a "shunt inductor," is coupled between the first current conducting terminal of transistor 120 and a first terminal of a first capacitor 142, which may be referred to herein as a "shunt capacitor." Finally, a third inductive element 140 (e.g., a fifth set of bondwires), which may be referred to herein as a "low-pass matching inductor," is coupled between the output lead 104 and a first terminal of a second capacitor 146, which may be referred to herein as a "low-pass matching capacitor." Second terminals of the shunt and low-pass matching capacitors 142, 144, 146 are coupled to ground, in an embodiment.

Shunt inductor 134 and shunt capacitor 142 are coupled in series between a current conducting terminal of transistor 120 and ground, and this combination of impedance matching elements functions as a first (high-pass) matching stage. Accordingly, the combination of shunt inductor 134 and shunt capacitor 142 may be referred to herein as a high-pass matching circuit 143. According to an embodiment shunt inductor 134 may have a value in a range between about 100 pH to about 3 nH, and shunt capacitor 142 may have a value in a range between about 50 pF to about 500 pF, although these components may have values outside of these ranges, as well.

An RF "cold point" is present at the node 148 between shunt inductor 134 and shunt capacitor 142, where the RF cold point represents a high impedance point in the circuit. Envelope frequency termination circuit 149 is coupled between the RF cold point (at node 148) and ground. Envelope frequency termination circuit 149 functions to improve the low frequency resonance of device 100 caused by the interaction between the output impedance matching circuit 150 and the bias feeds by presenting a high impedance at RF frequencies. Envelope frequency termination circuit 149 essentially is "invisible" from a matching standpoint, as it only effects the output impedance at envelope frequencies (i.e., envelope frequency termination circuit 149 provides terminations for the envelope frequencies of device 200). According to an embodiment, envelope frequency termination circuit 149 includes an inductive element 136, a resistor 138, and a capacitor 144, all coupled in series. The inductive element 136 (e.g., a sixth set of bondwires), which may be referred to herein as an "envelope inductor," is coupled between node 148 (or the first terminal of the shunt capacitor 142) and a first terminal of resistor 138, which may be referred to herein as an "envelope resistor." A second terminal of envelope resistor 138 is coupled to a first terminal of capacitor 144, which may be referred to herein as an "envelope capacitor." A second terminal of the envelope capacitor 144 is coupled to ground, in an embodiment. According to an embodiment envelope inductor 136 may have a value in a range between about 5 pH to about 500 pH, envelope resistor 138 may have a value in a range between about 0.1 Ohm to about 2 Ohm, and envelope capacitor 144 may have a value in a range between about 10 nanofarads (nF) to about 10 microfarads (µF), although these components may have values outside of these ranges, as well.

Low-pass matching inductor 140 and low-pass matching capacitor 146 are coupled in series between the output lead 104 and ground, and this combination of impedance matching elements functions as a second (low-pass) matching stage. Accordingly, the combination of low-pass matching inductor 140 and low-pass matching capacitor 146 may be referred to herein as a low-pass matching circuit 147. According to an embodiment low-pass matching inductor 140 may have a value in a range between about 50 pH to about 1 nH, and low-pass matching capacitor 146 may have a value in a range between about 1 pF to about 50 pF, although these components may have values outside of these ranges, as well.

Ideally, low-pass matching circuit 147 would include only the low-pass matching capacitor 146. Low-pass matching inductor 140 is not a particularly desirable element, for reasons explained below. However, low-pass matching inductor 140 is included in the low-pass matching circuit 147, in some embodiments, because a distinct electrical connection needs to be established between output lead 104 and the low-pass matching capacitor 146. Low-pass matching inductor 140 represents that electrical connection (e.g., low-pass matching inductor 140 may be implemented as a plurality of bondwires (e.g., bondwires 240, FIG. 2) between the output lead 104 and the low-pass matching capacitor 146). To achieve desired performance, the output impedance matching circuit 150 should be designed to compensate for the inductance of the low-pass matching inductor 140, even though such compensation may have other drawbacks (e.g., an increased size of low-pass matching capacitor 146). In addition, as will be explained in more detail later, undesirable inductive coupling may be present between the low-pass matching inductor 140 and other inductive elements of the system (e.g., series inductor 132 and shunt inductor 134), due to the relatively close physical proximity of these inductive elements. This inductive coupling may cause undesirable loss and sub-optimal impedance transformation in the output impedance matching circuit 150. As will be explained in more detail later, in some embodiments, low-pass matching inductor 140 may be eliminated.

As will be described below, a device's input lead, input impedance matching circuit, transistor, output impedance matching circuit, and output lead all may be incorporated into a single package, where the device's transistor is positioned within an active device area of the packaged device. In order to reduce package size in particular embodiments, certain elements of the impedance matching circuits are positioned away from the active device area of the packaged device, which enables relatively-small packaged devices with multi-stage matching to be produced. In addition, in certain embodiments, some elements of the impedance matching circuits are electrically coupled to other device elements using conductive interconnects other than bondwires, which may reduce manufacturing complexity and/or device cost.

Figure 2:
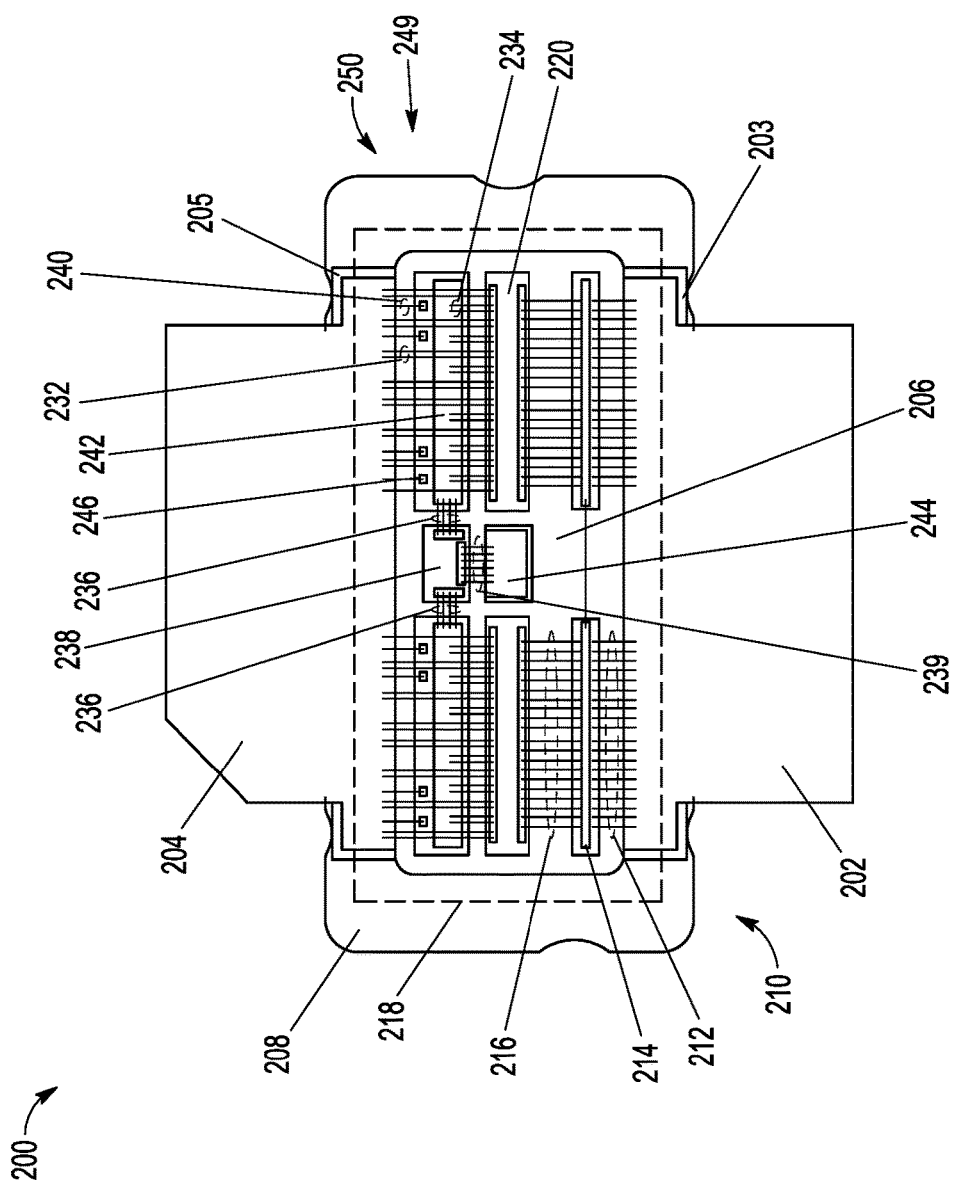
FIG. 2 is a top view of an example of a semiconductor device, in accordance with an example embodiment.

FIG. 2 is a top view of an embodiment of a semiconductor device 200 (e.g., an RF device). For example, the interconnected electrical components and elements of device 200 may be modeled by the schematic diagram of FIG. 1. Device 200 includes an input lead 202 (e.g., input lead 102, FIG. 1), an output lead 204 (e.g., output lead 104, FIG. 1), a flange 206, an isolation structure 208, one or more transistors 220 (e.g., transistor 120, FIG. 1), an input impedance matching circuit 210 (e.g., input impedance matching circuit 110, FIG. 1), an envelope frequency termination circuit 249 (e.g., envelope frequency termination circuit 149, FIG. 1), and an output impedance matching circuit 250 (e.g., output impedance matching circuit 150, FIG. 1), all of which may be packaged together as parts of the device (e.g., the above-listed components form portions of a single, discrete device). In the example of FIG. 2, device 200 includes two transistors 220 that essentially function in parallel, although another semiconductor device may include as few as one transistor or more than two transistors (e.g., as in the embodiments of FIGS. 3 and 6-8), as well. In addition, device 200 includes two input capacitors 214, two shunt capacitors 242, one envelope capacitor 244, and a plurality of low-pass matching capacitors 246, where sets of the same type of capacitor also essentially function in parallel. It is to be understood that more or fewer of capacitors 214, 242, 244, 246 may be implemented, as well. For purposes of clarity, transistors 220, input capacitors 214, shunt capacitors 242, and low-pass matching capacitors 246 each will be referred to in the singular sense, below. It is to be understood that the description of a particular device component in the singular sense applies to the set of all such components.

According to an embodiment, device 200 is incorporated in an air cavity package, in which substantially all electrical components of device 200 (except for the portions of leads 202, 204 that extend beyond the edge of isolation structure 208) are located within an enclosed air cavity. Basically, the air cavity is bounded on the bottom by flange 206, isolation structure 208, and a cap overlying and in contact with the isolation structure 208 and leads 202, 204. Although the cap is not illustrated in FIG. 2, an example perimeter of the cap is indicated by dashed box 218. In alternate embodiments, a device may be incorporated into an overmolded package (i.e., a package in which at least the transistors 220 and other electrical components within the active device area are encompassed by a non-conductive molding compound, and in which portions of the leads 202, 204, and all or portions of the isolation structure 208 and elements outside of the active device area also may be encompassed by the molding compound).

Flange 206 includes a rigid electrically-conductive substrate, which has a thickness that is sufficient to provide structural support for other components and elements of device 200. In addition, flange 206 may function as a heat sink for transistor 220 and other devices mounted on flange 206. Flange 206 has a top and bottom surface (only a central portion of the top surface is visible in FIG. 2), and a substantially-rectangular perimeter that corresponds to the perimeter of the device 200. In FIG. 2, only a central portion of flange 206 is shown through an opening in isolation structure 208. However, flange 206 also extends under the entirety of isolation structure 208, as well. Flange 206 may extend beyond the perimeter of isolation structure 208, although such extensions are not shown in FIG. 2. Flange 206 has a conductive top surface (i.e., the surface on which isolation structure 208 is attached), and may be formed entirely from a conductive material. Alternatively, flange 206 may have one or more layers of non-conductive material below its top surface. When device 200 is incorporated into a larger electrical system, flange 206 may be used to provide a ground reference for the device 200. For example, various components and elements may have terminals that are electrically coupled to flange 206, and flange 206 may be electrically coupled to a system ground. Flange 206 may more generally be referred to as a substrate with a conductive surface. At least the surface of flange 206 is formed from a layer of conductive material, and possibly all of flange 206 is formed from bulk conductive material. Either way, flange 206 has a conductive surface.

Isolation structure 208 is attached to the top surface of flange 206. For example, isolation structure 208 may include a layer of metallization (e.g., metallization 420, FIGS. 4, 5) on its bottom surface, which may be soldered to or otherwise attached to the top surface of flange 206. Isolation structure 208 is formed from a rigid, electrically insulating material (e.g., a material with a dielectric constant in a range from about 3.0 to about 10.0, although materials with higher or lower dielectric constants may be used), and has a top surface and an opposed bottom surface. The term "isolation structure," as used herein, refers to a structure that provides electrical isolation between conductive features of a device (e.g., between leads 202, 204 and flange 206). For example, isolation structure 208 may be formed from inorganic materials (e.g., ceramic such as aluminum oxide, aluminum nitride, and so on) and/or organic materials (e.g., one or more polymers or printed circuit board (PCB) materials). In an embodiment in which isolation structure 208 comprises PCB materials (e.g., the isolation structure 208 essentially includes a single or multi-layer PCB), conductive layers (e.g., copper layers) may be included on the top and bottom surfaces of the isolation structure. In a further embodiment, a conductive layer on the top surface of the isolation structure 208 may be patterned and etched to form a leadframe (including leads 202, 204) for the device 200, and a conductive layer on the bottom surface of the isolation structure 208 may be coupled to the flange 206. In other embodiments, conductive layers may be excluded from the top and/or bottom surface of the isolation structure 208. In such embodiments, leads (e.g., leads 202, 204) may be coupled to the isolation structure 208 using epoxy (or other adhesive materials), and/or the isolation structure 208 may be coupled to the flange 206 using epoxy (or other adhesive materials). In still other embodiments, the isolation structure 208 may be milled at the portion of its top surface to which a lead is attached.

According to an embodiment, isolation structure 208 generally has a frame shape, which includes a substantially enclosed structure with a central opening. Isolation structure 208 may have a substantially rectangular shape, as shown in FIG. 2, or isolation structure 208 may have another shape (e.g., annular ring, oval, and so on). Isolation structure 208 may be formed as a single, integral structure, or isolation structure 208 may be formed as a combination of multiple members. For example, in an alternate embodiment, isolation structure 208 may include multiple portions that contact each other or that are spatially separated from each other (e.g., isolation structure 208 may have one portion isolating input lead 202 from flange 206, and another portion isolating output lead 204 from flange 206). In an embodiment in which isolation structure 208 includes multiple, spatially separated portions, the "central opening" in isolation structure 208 is considered to be the space between the multiple, spatially separated portions. In addition, isolation structure 208 may be formed from a homogenous material, or isolation structure 208 may be formed from multiple layers. The input and output leads 202, 204 are mounted on a top surface of the isolation structure 208 on opposed sides of the central opening, and thus the input and output leads 202, 204 are elevated above the top surface of the flange 206, and are electrically isolated from the flange 206. For example, the input and output leads 202, 204 may be soldered or otherwise attached to metallization 203, 205 on a top surface of isolation structure 208. Generally, the input and output leads 202, 204 are oriented in order to allow for attachment of bondwires (e.g., bondwires 212, 232, 240) between the input and output leads 202, 204 and components and elements within the central opening of isolation structure 208.

Transistor 220 and various elements 214, 238, 242, 244, 246 of the input and output impedance matching circuits 210, 250 are mounted on a generally central portion of the top surface of a flange 206 that is exposed through the opening in isolation structure 208. As used herein, an "active device area" corresponds to a portion of a device on which one or more active devices (e.g., transistor 220) are mounted (e.g., the portion of the conductive surface of flange 206 that exposed through the opening in isolation structure 208). Alternatively, an "active device area" may be defined as a portion of a device that is contained within the opening in the device's isolation structure (e.g., the portion of device 200 within the opening of isolation structure 208). According to an embodiment, any portion of device 200 that does not correspond to the portion of flange 206 that is exposed through the opening in isolation structure 208 is not considered to be within the active device area. Accordingly, in FIG. 2, transistor 220 is positioned within the active device area of device 200. In the embodiment of FIG. 2, impedance matching elements 214, 238, 242, 244, 246 also are positioned within the active device area of device 200.

Transistor 220 has a control terminal (e.g., a gate) and two current conducting terminals (e.g., a drain and a source). The control terminal of transistor 220 is coupled to the input impedance matching circuit 210 (e.g., via bondwires 216 between input capacitor 214 and transistor 220). In addition, one current conducting terminal (e.g., the drain) is coupled to the output impedance matching circuit 250 (e.g., via bondwires 234 between transistor 220 and capacitor 242), and the other current conducting terminal (e.g., the source) is coupled to the flange 206 (e.g., to ground), in an embodiment.

The input impedance matching circuit 210 (e.g., input impedance matching circuit 110, FIG. 1) is coupled between the input lead 202 (e.g., input lead 102, FIG. 1) and the control terminal of the transistor 220 (e.g., transistor 120, FIG. 1). In the device 200 of FIG. 2, the input impedance matching circuit 210 includes two inductive elements 212, 216 (e.g., inductive elements 112, 116, FIG. 1) and a capacitor 214 (e.g., capacitor 114, FIG. 1). Each inductive element 212, 216 is formed from a plurality of parallel, closely-spaced sets of bondwires. For example, a first inductive element 212 (e.g., inductive element 112, FIG. 1) includes a plurality of bondwires coupled between input lead 202 and a first terminal of capacitor 214 (e.g., capacitor 114, FIG. 1), and a second inductive element 216 (e.g., inductive element 116, FIG. 1) includes a plurality of bondwires coupled between the first terminal of capacitor 214 and the control terminal of transistor 220. The second terminal of capacitor 214 is coupled to the flange 206 (e.g., to ground). Capacitor 214 may be, for example, a discrete silicon capacitor (e.g., comprised of a silicon substrate with a top surface corresponding to a first terminal, and a bottom surface corresponding to a second terminal), a discrete ceramic capacitor, or another type of capacitor. Bondwires 212, 216 are attached to a conductive top plate at the top surface of capacitor 214.

The output impedance matching circuit 250 (e.g., output impedance matching circuit 150, FIG. 1) is coupled between a first current conducting terminal (e.g., drain) of transistor 220 (e.g., transistor 120, FIG. 1) and the output lead 204 (e.g., output lead 104, FIG. 1). In the device 200 of FIG. 2, the output impedance matching circuit 250 includes three inductive elements 232, 234, 240 (e.g., inductors 132, 134, 140, FIG. 1) and two capacitors 242, 246 (e.g., capacitors 142, 146, FIG. 1). Again, each inductive element 232, 234, 240 is formed from a plurality of parallel, closely-spaced sets of bondwires. For example, a series inductive element 232 (e.g., series inductor 132, FIG. 1) includes a plurality of bondwires coupled between the first current conducting terminal (e.g., the drain) of transistor 220 and the output lead 204. A shunt inductive element 234 (e.g., shunt inductor 134, FIG. 1) includes a plurality of bondwires coupled between the first current conducting terminal of transistor 220 and a first terminal of a shunt capacitor 242 (e.g., shunt capacitor 142, FIG. 1). Finally, a low-pass matching inductive element 240 (e.g., low-pass matching inductor 140, FIG. 1) is coupled between the output lead 204 and a first terminal of a low-pass matching capacitor 246 (e.g., low-pass matching capacitor 146, FIG. 1). Second terminals of capacitors 242, 246 are coupled to the flange 206 (e.g., to ground) (i.e., capacitors 242, 246 are mounted on flange 306 in the active device area).

An RF cold point is present at interconnection between shunt inductor 234 and shunt capacitor 242. Envelope frequency termination circuit 249 (e.g., envelope frequency termination circuit 149, FIG. 1) is coupled between the RF cold point and the flange 206 (e.g., to ground). In the device of FIG. 2, envelope frequency termination circuit 249 includes inductive element 236 (e.g., inductor 136, FIG. 1), resistor 238 (e.g., resistor 138, FIG. 1), and capacitor 244 (e.g., capacitor 144, FIG. 1), all coupled in series. Again, envelope inductive element 236 is formed from a plurality of parallel, closely-spaced sets of bondwires. For example, envelope inductive element 236 (e.g., envelope inductor 136, FIG. 1) includes a plurality of bondwires coupled between the first terminal of shunt capacitor 242 and a first terminal of envelope resistor 238 (e.g., envelope resistor 138, FIG. 1). A second terminal of envelope resistor 238 is coupled to a first terminal of an envelope capacitor 244 (e.g., envelope capacitor 144, FIG. 1) via bondwires 239. A second terminal of capacitor 244 is coupled to the flange 206 (e.g., to ground) (i.e., capacitor 244 is mounted on flange 306 in the active device area).

Envelope resistor 238 may be, for example, a discrete resistor, a thick film resistor, a thin film resistor, or another type of resistor. Capacitors 242, 244, 246 may be, for example, discrete silicon capacitors, discrete ceramic capacitors, capacitors that are integrally formed with other structures (e.g., with an isolation structure), or other types of capacitors. Bondwires corresponding to inductive elements 234, 236, 240 are attached to conductive top plates at the top surfaces of capacitors 242, 244, 246.

The embodiment illustrated in FIG. 2 provides good electrical performance, when compared with other conventional semiconductor devices. However, the inclusion of low-pass matching inductive element 240 may result in undesired losses and inductive coupling with other elements (e.g., inductive elements 232, 234), as described above, and thus the electrical performance of device 200 may be sub-optimal. In addition, the inclusion of substantially all of the impedance matching elements within the active device area warrants either a reduction in the space that may be allocated for active devices (e.g., transistors) or an increase in the active device area, and thus an increase in the package size. In the embodiments illustrated and described in conjunction with FIGS. 3-11, at least some of the output circuit elements are positioned at locations outside of the active device area, thus allowing for larger or more active devices within the active device area or smaller package sizes. For example, in the embodiments of FIGS. 3-11, envelope capacitors (e.g., envelope capacitor 144, FIG. 1) and envelope resistors (e.g., envelope resistor 138, FIG. 1) are positioned outside the active device area, and more specifically on a top surface of an isolation structure. Other impedance matching elements (e.g., low-pass matching capacitor 146, FIG. 1 and/or other elements) also may be positioned outside of the active device area, as well.

Figure 3:
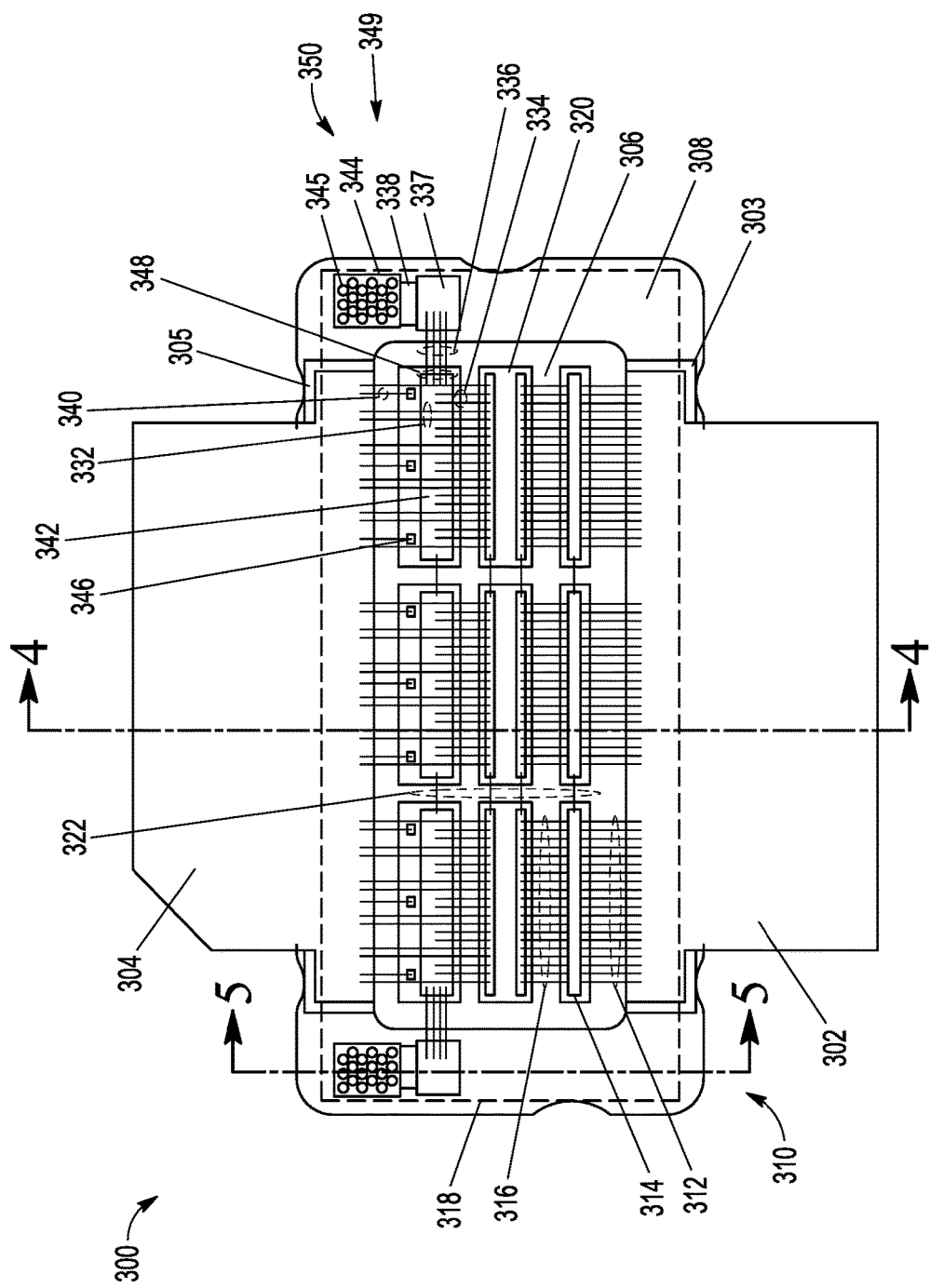
FIG. 3 is a top view of a semiconductor device, in accordance with another example embodiment.
Figure 4:
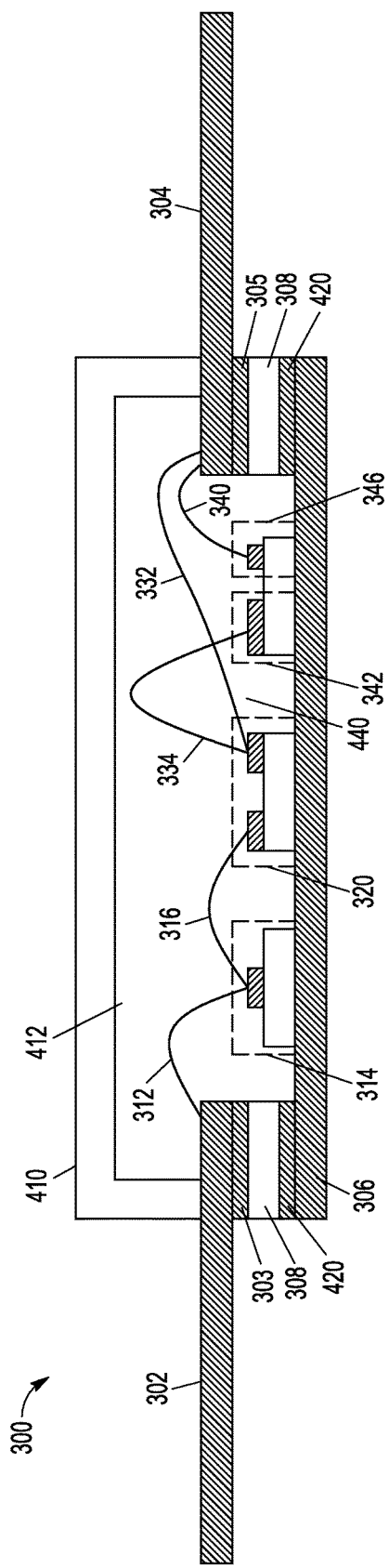
FIG. 4 is a cross-sectional, side view of the semiconductor device of FIG. 3 along line 4-4.
Figure 5:
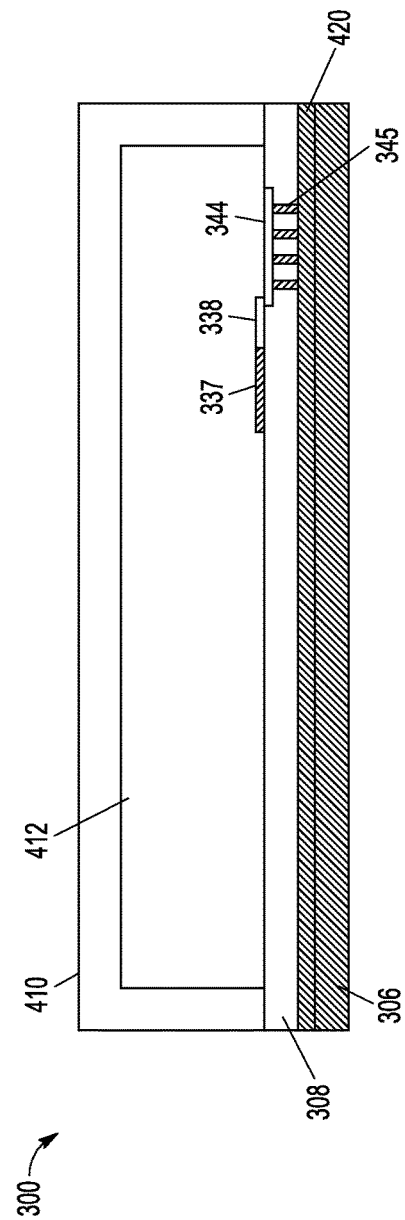
FIG. 5 is a cross-sectional, side view of the semiconductor device of FIG. 3 along line 5-5.

FIG. 3 is a top view of a semiconductor device 300 (e.g., an RF device), in accordance with an example embodiment. For example, the interconnected electrical components and elements of device 300 may be modeled by the schematic diagram of FIG. 1. For enhanced understanding, FIG. 3 should be viewed in conjunction with FIGS. 4 and 5, which are cross-sectional, side views of the semiconductor device of FIG. 3 along lines 4-4 and 5-5, respectively. More specifically, FIG. 4 is a cross-sectional view through input and output leads 302, 304 and the active device area, and FIG. 5 is a cross-sectional view through an end portion of isolation structure 308 (i.e., an area outside the active device area). FIGS. 4 and 5 also illustrate a cap 410, which may be implemented in air cavity package embodiments to seal the interior components of device 300 within an air cavity 412.

Device 300 includes an input lead 302 (e.g., input lead 102, FIG. 1), an output lead 304 (e.g., output lead 104, FIG.

1), a flange 306, an isolation structure 308, one or more transistors 320 (e.g., transistor 120, FIG. 1), an input impedance matching circuit 310 (e.g., input impedance matching circuit 110, FIG. 1), an envelope frequency termination circuit 349 (e.g., envelope frequency termination circuit 149, FIG. 1), and an output impedance matching circuit 350 (e.g., output impedance matching circuit 150, FIG. 1), all of which may be packaged together as parts of the device. In the example of FIG. 3, device 300 includes three transistors 320 that essentially function in parallel, although another semiconductor device may include one or two transistors or more than three transistors, as well. In addition, device 300 includes three input capacitors 314, three shunt capacitors 342, two envelope capacitors 344, and a plurality of low-pass matching capacitors 246, where sets of the same type of capacitor also essentially function in parallel. It is to be understood that more or fewer of capacitors 214, 242, 246 may be implemented, as well. For purposes of clarity, transistors 220, shunt capacitors 214, envelope capacitors 242, and low-pass matching capacitors 246 each will be referred to in the singular sense, below, as will analogous components in other, later-described figures. It is to be understood that the description of a particular device component in the singular sense applies to the set of all such components. According to an embodiment, jumper wires 322 may be electrically coupled between the multiple transistors 320, input capacitors 314, and shunt capacitors 342, in order to provide low frequency paths between corresponding components.

According to an embodiment, device 300 is incorporated in an air cavity package, in which transistor 320 and various impedance matching elements 312, 314, 316, 332, 334, 340, 342, and 344 are located within an enclosed air cavity. In addition, impedance matching elements 338, 346 also are located within the air cavity in the embodiment illustrated in FIG. 3, although either or both impedance matching elements 338, 346 may be located outside of the air cavity in alternate embodiments. Basically, the air cavity is bounded by flange 306, isolation structure 308, and a cap overlying and in contact with the isolation structure 308 and leads 302, 304. Although the cap is not illustrated in FIG. 3, an example perimeter of the cap is indicated by dashed box 318. In another embodiment, the cap may be sized so that envelope capacitor 344 and envelope resistor 338 are not contained within the air cavity (e.g., inductive element 336 extends through an opening between the cap and the isolation structure 308). In other alternate embodiments, a device may be incorporated into an overmolded package (i.e., a package in which at least the transistors 320 and other electrical components within the active device area are encompassed by a non-conductive molding compound, and in which portions of the leads 302, 304, and all or portions of the isolation structure 308 and elements outside of the active device area also may be encompassed by the molding compound).

Flange 306 includes a rigid electrically-conductive substrate, which has a thickness that is sufficient to provide structural support for other components and elements of device 300. In addition, flange 306 may function as a heat sink for transistor 320 and other devices mounted on flange 306. Flange 306 has a top and bottom surface (only a central portion of the top surface is visible in FIG. 3), and a substantially-rectangular perimeter that corresponds to the perimeter of the device 300 (e.g., to the perimeter of isolation structure 308, described below). Flange 306 is formed from a conductive material, and may be used to provide a ground reference for the device 300. For example, various components and elements may have terminals that are electrically coupled to flange 306, and flange 306 may be electrically coupled to a system ground when the device 300 is incorporated into a larger electrical system.

Isolation structure 308 is attached to the top surface of flange 306. For example, isolation structure 308 may include a layer of metallization 420 on its bottom surface, which may be soldered to or otherwise attached to the top surface of flange 306. Isolation structure 308 is formed from a rigid, electrically insulating material (i.e., a material with a dielectric constant in a range from about 3.0 to about 10.0, although materials with higher or lower dielectric constants may be used), and has a top surface and an opposed bottom surface. For example, isolation structure 308 may be formed from inorganic materials (e.g., ceramic such as aluminum oxide, aluminum nitride, and so on) and/or organic materials (e.g., one or more polymers or PCB materials). In an embodiment in which isolation structure 308 comprises PCB materials (e.g., the isolation structure 308 essentially includes a single or multi-layer PCB), conductive layers (e.g., copper layers) may be included on the top and bottom surfaces of the isolation structure 308. In a further embodiment, a conductive layer on the top surface of the isolation structure 308 may be patterned and etched to form a leadframe for the device 300, and a conductive layer on the bottom surface of the isolation structure 308 may be coupled to the flange 306.

Isolation structure 308 has a frame shape, in an embodiment, which includes a substantially enclosed, four-sided structure with a central opening. Isolation structure 308 may have a substantially rectangular shape, as shown in FIG. 3, or isolation structure 308 may have another shape (e.g., annular ring, oval, and so on). Isolation structure 308 may be formed as a single, integral structure, or isolation structure 308 may be formed as a combination of multiple members. For example, in an alternate embodiment, isolation structure 308 may include multiple portions that contact each other or that are spatially separated from each other (e.g., isolation structure 308 may have one portion isolating input lead 302 from flange 306, and another portion isolating output lead 304 from flange 306). In addition, isolation structure 308 may be formed from a homogenous material, or isolation structure 308 may be formed from multiple layers. The input and output leads 302, 304 are mounted on a top surface of the isolation structure 308 on opposed sides of the central opening, and thus the input and output leads 302, 304 are elevated above the top surface of the flange 306, and are electrically isolated from the flange 306. For example, the input and output leads 302, 304 may be soldered or otherwise attached to metallization 303, 305 on a top surface of isolation structure 308. The metallization 303, 305 may be considered to be conductive pads to which the input and output leads 302, 304 are coupled. Generally, the input and output leads 302, 304 are oriented in order to allow for attachment of bondwires (e.g., bondwires 312, 332, 340) between the input and output leads 302, 304 and components and elements within the central opening of isolation structure 308.

Transistor 320 and various elements 314, 342, 346 of the input and output impedance matching circuits 310, 350 are mounted on a generally central portion of the top surface of a flange 306 that is exposed through the opening in isolation structure 308. According to an embodiment, transistor 320 is positioned within the active device area of device 300, along with impedance matching elements 314, 342, 346.

Transistor 320 has a control terminal (e.g., a gate) and two current conducting terminals (e.g., a drain and a source). The control terminal of transistor 320 is coupled to the input impedance matching circuit 310 (e.g., via bondwires 316 between input capacitor 314 and transistor 320). In addition, one current conducting terminal (e.g., the drain) is coupled to the output impedance matching circuit 350 (e.g., via bondwires 334 between transistor 320 and capacitor 342) and to the output lead 304 (e.g., via bondwires 332 between transistor 320 and output lead 304). The other current conducting terminal (e.g., the source) is coupled to the flange 306 (e.g., to ground), in an embodiment.

The input impedance matching circuit 310 (e.g., input impedance matching circuit 110, FIG. 1) is coupled between the input lead 302 (e.g., input lead 102, FIG. 1) and the control terminal of the transistor 320 (e.g., transistor 120, FIG. 1). In the device 300 of FIG. 3, the input impedance matching circuit 310 includes two inductive elements 312, 316 (e.g., inductive elements 112, 116, FIG. 1) and a capacitor 314 (e.g., capacitor 114, FIG. 1). As with the embodiment of FIG. 2, each inductive element 312, 316 is formed from a plurality of parallel, closely-spaced sets of bondwires. For example, a first inductive element 312 (e.g., inductive element 112, FIG. 1) includes a plurality of bondwires coupled between input lead 302 and a first terminal of capacitor 314 (e.g., capacitor 114, FIG. 1), and a second inductive element 316 (e.g., inductive element 116, FIG. 1) includes a plurality of bondwires coupled between the first terminal of capacitor 314 and the control terminal of transistor 320. The second terminal of capacitor 314 is coupled to the flange 306 (e.g., to ground). Capacitor 314 may be, for example, a discrete silicon capacitor, a discrete ceramic capacitor, or another type of capacitor. Bondwires 312, 316 are attached to a conductive top plate at the top surface of capacitor 314.

The output impedance matching circuit 350 (e.g., output impedance matching circuit 150, FIG. 1) is coupled between a first current conducting terminal (e.g., drain) of transistor 320 (e.g., transistor 120, FIG. 1) and the output lead 304 (e.g., output lead 104, FIG. 1). In the device 300 of FIG. 3, the output impedance matching circuit 350 includes three inductive elements 332, 334, 340 (e.g., inductors 132, 134, 140, FIG. 1) and two capacitors 342, 346 (e.g., capacitors 142, 146, FIG. 1). Again, each inductive element 332, 334, 340 is formed from a plurality of parallel, closely-spaced sets of bondwires.

For example, a series inductive element 332 (e.g., series inductor 132, FIG. 1) includes a plurality of bondwires coupled between the first current conducting terminal (e.g., the drain) of transistor 320 and the output lead 304. A shunt inductive element 334 (e.g., shunt inductor 134, FIG. 1) includes a plurality of bondwires coupled between the first current conducting terminal of transistor 320 and a first terminal of shunt capacitor 342 (e.g., shunt capacitor 142, FIG. 1). A low-pass matching inductive element 340 (e.g., low-pass matching inductor 140, FIG. 1) is coupled between the output lead 304 and a first terminal of low-pass matching capacitor 346 (e.g., low-pass matching capacitor 146, FIG. 1). Second terminals of capacitors 342, 346 are coupled to the flange 306 (e.g., to ground) (i.e., capacitors 342, 346 are mounted on flange 306 in the active device area). Capacitors 342, 346 may be, for example, discrete silicon capacitors, discrete ceramic capacitors, or other types of capacitors. In addition, capacitors 342, 346 may be distinct from each other, or may be formed as an integrated discrete device (e.g., as shown in FIG. 3). Bondwires corresponding to inductive elements 334, 340 are attached to conductive top plates at the top surfaces of capacitors 342, 346. Referring to FIG. 4, it is notable that the inductive coupling between bondwires 332 and 334 is related to the area 440 underneath both sets of bondwires 332, 334 (e.g., the larger the area 440, the higher the inductive coupling, and vice versa). In order to reduce that area 440, bondwires 332 are desirably as short as possible, while still ensuring that bondwires 332 are a reasonable distance above bondwires 340. Essentially, the height of bondwires 340 determines the height of bondwires 332.

In contrast with the embodiment illustrated in FIG. 2, elements of the envelope frequency matching circuit 349 (i.e., envelope resistor 338 and envelope capacitor 344) are located in or on isolation structure 308, rather than being located within the active device area. In other words, instead of being mounted on flange 306 in the active device area, envelope resistor 338 and envelope capacitor 344 are located outside of the active device area, and are electrically coupled with the rest of the output impedance matching circuit 250 through additional conductive features. More specifically, in the illustrated embodiment in which leads 302, 304 are coupled to two opposed portions (or sides) of a four-sided isolation structure 308, envelope resistor 338 and envelope capacitor 344 are located in or on two other opposed portions (or sides) of the isolation structure 308 (e.g., envelope resistor 338 and envelope capacitor 344 are located on portions of the isolation structure 308 other than the portions to which the leads 302, 304 are coupled). Described another way, when isolation structure 308 is considered to have two lead-supporting portions (or sides) to which leads 302, 304 are coupled, and two non-lead-supporting portions (or sides) to which leads 302, 304 are not coupled (e.g., sides spanning between the lead-supporting portions or other portions of isolation structure 308 that do not support the leads 302, 304), envelope resistor 338 and envelope capacitor 344 are located in or on the two non-lead-supporting portions. In an alternate embodiment, either or both of envelope resistor 338 and/or envelope capacitor 344 may be located in or on the lead-supporting portions of isolation structure 308. In other alternate embodiments, only a single envelope resistor 338 and/or envelope capacitor 344 may be included.

For example, in an embodiment, device 300 also includes a conductive pad 337 on a top surface of the isolation structure 308, and the conductive pad 337 provides electrical connectivity between envelope resistor 338 and envelope inductive element 336. More particularly, according to an embodiment, envelope inductive element 336 (e.g., envelope inductor 136, FIG. 1) is coupled between the first terminal of capacitor 342 (or a conductive top plate at the top surface of capacitor 342) and conductive pad 337. The RF cold point 348 (e.g., corresponding to node 148, FIG. 1) of device 300 is located at the first terminal of capacitor 342. A first terminal of envelope resistor 338 (e.g., envelope resistor 138, FIG. 1) also is attached to conductive pad 337, and thus an electrical connection between the envelope inductive element 336 and resistor 338 is established through the conductive pad 337. A second terminal of resistor 338 is coupled to a first terminal of envelope capacitor 344 (e.g., envelope capacitor 144, FIG. 1). According to various embodiments, resistor 338 is a thick or thin film resistor.

Envelope capacitor 344 may be, for example, a multiple-layer capacitor (e.g., a capacitor with multiple first plates coupled to a first terminal (or plate) on the top of the capacitor, and multiple second plates coupled to a second terminal (or plate) on the bottom of the capacitor, where the first and second plates are interdigitated or interleaved), in various embodiments. For example, in an embodiment, envelope capacitor 344 may be integrally formed with isolation structure 308 (e.g., at least the portion of isolation structure 308 at which the envelope capacitor 344 is located may be a multi-layer structure, with alternating conductive and dielectric layers of the isolation structure 308 forming envelope capacitor 344). The top conductive layer of envelope capacitor 344 is coupled to the second terminal of envelope resistor 338. The bottom conductive layer of envelope capacitor 344 is coupled to flange 306. For example, the bottom conductive layer may be coupled to flange 306 through one or more conductive vias 345 (which would actually be hidden, but are shown in FIG. 3 for purposes of clarity) extending between the bottom conductive layer of capacitor 344 and the bottom surface of isolation structure 308. More specifically, a second terminal of envelope capacitor 344 may be coupled to first ends of vias 345 within isolation structure 306, and second ends of vias 345 at the bottom surface of isolation structure 306 are coupled to flange 306 (e.g., through metallization 420, FIG. 4). Accordingly, vias 345 establish an electrical connection between envelope capacitor 344 and flange 306 (e.g., ground). In an alternate embodiment, vias 345 may be replaced by edge plating or castellations, which extend between the bottom layer of envelope capacitor 344 and the bottom surface of isolation structure 308 along a perimeter edge of isolation structure 308, where the edge plating or castellations provide an electrical connection between envelope capacitor 344 and flange 306. Such vias 345, edge plating, and castellations may be generally referred to herein as "conductive structures" in or on the isolation structure, which electrically couple the envelope capacitor 344 to the conductive surface of the flange 306. In another alternate embodiment in which the thickness of isolation structure 308 is substantially equal to the thickness of envelope capacitor 344, vias 345 (or other conductive structures) may be eliminated, as the bottom layer of envelope capacitor 344 may be substantially co-planar with the bottom surface of isolation structure 308.

An advantage to the embodiment of FIG. 3 is that the discrete components associated with the envelope frequency termination circuit 349 (specifically envelope resistor 338 and envelope capacitor 344) are not located within the active device area. Instead, these elements are located outside the active device area (specifically in or on the isolation structure 308). Accordingly, more space is available for active devices within the active device area, and/or the active device area (and thus the device 300) may have a smaller size, when compared with the device 200 of FIG. 2). In alternate embodiments, portions of the input impedance matching circuit 310 (e.g., input capacitor 314) may be located on the isolation structure 308, and/or portions of the output impedance matching circuit 350 may be located on the isolation structure 308. In still other embodiments, the envelope capacitor 344 (e.g., envelope capacitor 144, FIG. 1) and/or the envelope resistor 338 (e.g., envelope resistor 138, FIG. 1) may be implemented using differently configured components.

Figure 6:
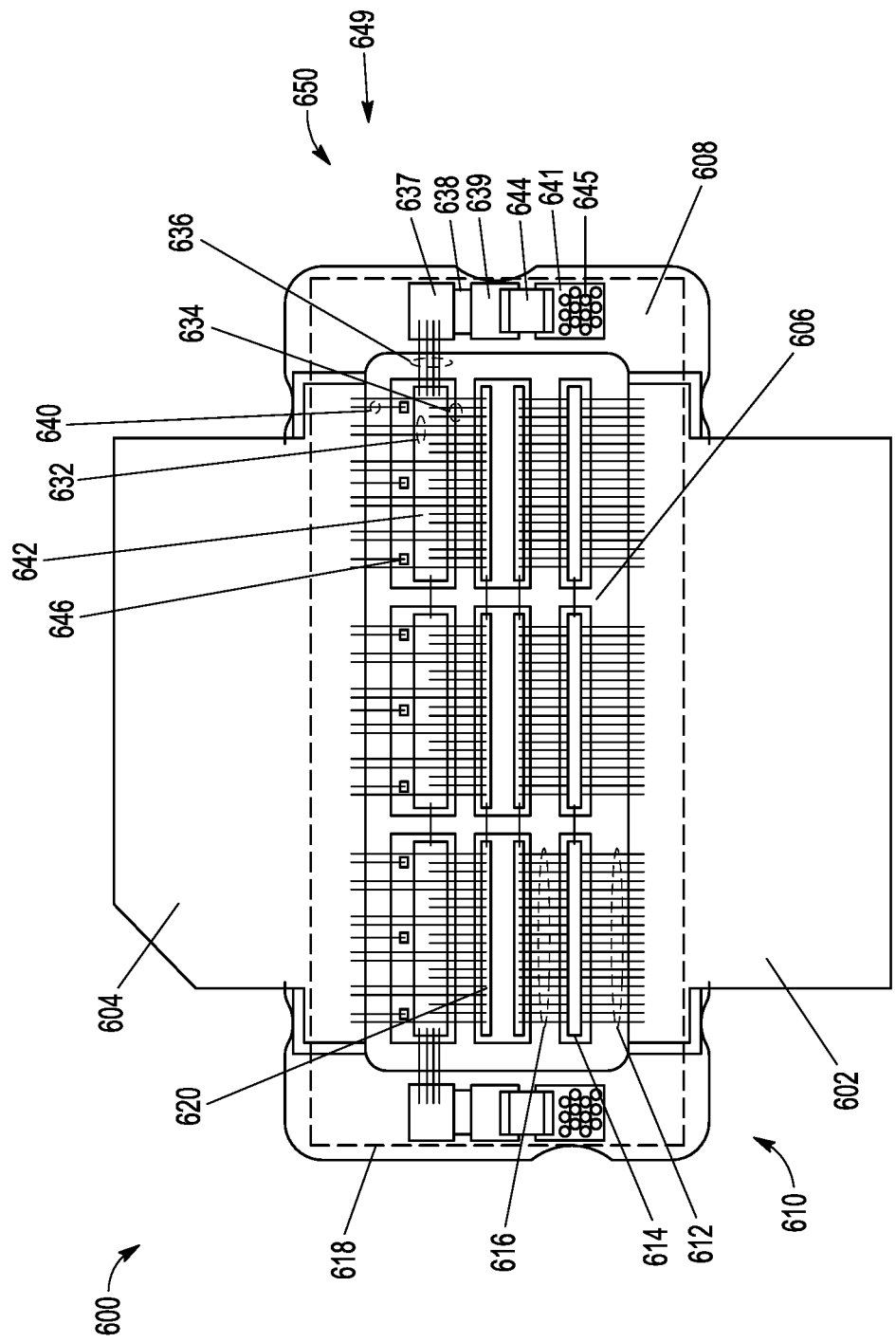
FIG. 6 is a top view of a semiconductor device, in accordance with yet another example embodiment.

For example, FIG. 6 is a top view of a semiconductor device 600, in accordance with another example embodiment. The device 600 of FIG. 6 is similar to the device 300 of FIG. 3, in that the device 600 of FIG. 6 also includes an input lead 602 (e.g., input lead 102, FIG. 1), an output lead 604 (e.g., output lead 104, FIG. 1), a flange 606, an isolation structure 608, one or more transistors 620 (e.g., transistor 120, FIG. 1), an input impedance matching circuit 610 (e.g., input impedance matching circuit 110, FIG. 1), an envelope frequency termination circuit 649 (e.g., envelope frequency termination circuit 149, FIG. 1), and an output impedance matching circuit 650 (e.g., output impedance matching circuit 150, FIG. 1), all of which may be packaged together as parts of the device. The input impedance matching circuit 610 includes two inductive elements 612, 616 (e.g., inductive elements 112, 116, FIG. 1) and a capacitor 614 (e.g., capacitor 114, FIG. 1). The output impedance matching circuit 650 includes three inductive elements 632, 634, 640 (e.g., inductors 132, 134, 140, FIG. 1) and two capacitors 642, 646 (e.g., capacitors 142, 146, FIG. 1). The envelope frequency termination circuit 649 includes inductive element 636 (e.g., inductive element 136, FIG. 1), resistor 638 (e.g., resistor 138, FIG. 1), and capacitor 644 (e.g., capacitor 144, FIG. 1). Transistor 620 and various elements 614, 642, 646 of the input and output impedance matching circuits 610, 650 are located on flange 606 within the active device area of device 600. Further, device 600 may be incorporated in an air cavity package with a cap (not shown) having an example perimeter indicated by dashed box 618. In another embodiment, the cap may be sized so that envelope capacitor 644 and envelope resistor 638 are not contained within the air cavity (e.g., inductive element 636 extends through an opening between the cap and the isolation structure 608). In other alternate embodiments, device 600 may be incorporated into an overmolded package.

Similar to the embodiment illustrated in FIG. 3, elements of the envelope frequency matching circuit 649 (i.e., envelope resistor 638 and envelope capacitor 644) are located in or on isolation structure 608 (e.g., on the top surface of isolation structure 608), rather than being located within the active device area. However, the device 600 of FIG. 6 differs from the device 300 of FIG. 3 in that envelope capacitor 644 is implemented as a surface-mounted, discrete capacitor (or a "chip capacitor") having terminals on opposed ends of the capacitor 644, rather than as a multilayer capacitor 344 integrated into the isolation structure 308, as in the device 300 of FIG. 3. Envelope capacitor 644 is coupled to (e.g., bonded to, soldered to, and/or adhered to) the top surface of isolation structure 608. Envelope resistor 638 may be a thick or thin film resistor, for example. In addition, according to an embodiment, device 600 has a different configuration of conductive pads 637, 639, 641 with which the envelope inductive element 636 (e.g., envelope inductor 136, FIG. 1), the envelope resistor 638 (e.g., envelope resistor 138, FIG. 1), and the envelope capacitor 644 (e.g., envelope capacitor 144, FIG. 1) are coupled. Conductive pads 637, 639, 641 each are located on a top surface of isolation structure 608. Conductive pad 637 provides electrical connectivity between envelope inductive element 636 and envelope resistor 638. Conductive pad 639 provides electrical connectivity between envelope resistor 638 and envelope capacitor 644. Finally, conductive pad 641 and conductive vias 645 (and possibly metallization on the bottom surface of flange 608) provide electrical connectivity between envelope capacitor 644 and flange 606.

More particularly, according to an embodiment, envelope inductive element 636 is coupled between the first terminal of capacitor 642 and conductive pad 637. A first terminal of envelope resistor 638 also is coupled to conductive pad 637, and thus an electrical connection between the envelope inductive element 636 and envelope resistor 638 is established through conductive pad 637. A second terminal of envelope resistor 638 is coupled to conductive pad 639. A first terminal of envelope capacitor 644 also is coupled to conductive pad 639, and thus an electrical connection between the envelope resistor 638 and envelope capacitor 644 is established through conductive pad 639. A second terminal of envelope capacitor 644 is coupled to conductive pad 641. In addition, conductive pad 641 (and thus envelope capacitor 644) is electrically coupled to flange 606 through one or more conductive vias 645 (which would actually be hidden, but are shown in FIG. 6 for purposes of clarity) extending between the top and bottom surfaces of isolation structure 608. More specifically, conductive pad 641 is coupled to first ends of vias 645 at the top surface of isolation structure 606, and second ends of vias 645 at the bottom surface of isolation structure 606 are coupled to flange 606 (e.g., through metallization 420, FIG. 4). Accordingly, conductive pad 641 and vias 645 establish an electrical connection between envelope capacitor 644 and flange 606 (e.g., ground). In an alternate embodiment, vias 645 may be replaced by edge plating or castellations, which extend between the top and bottom surfaces of isolation structure 608 along a perimeter edge of isolation structure 608, where the edge plating or castellations provide an electrical connection between conductive pad 641 and flange 606.

Figure 7:
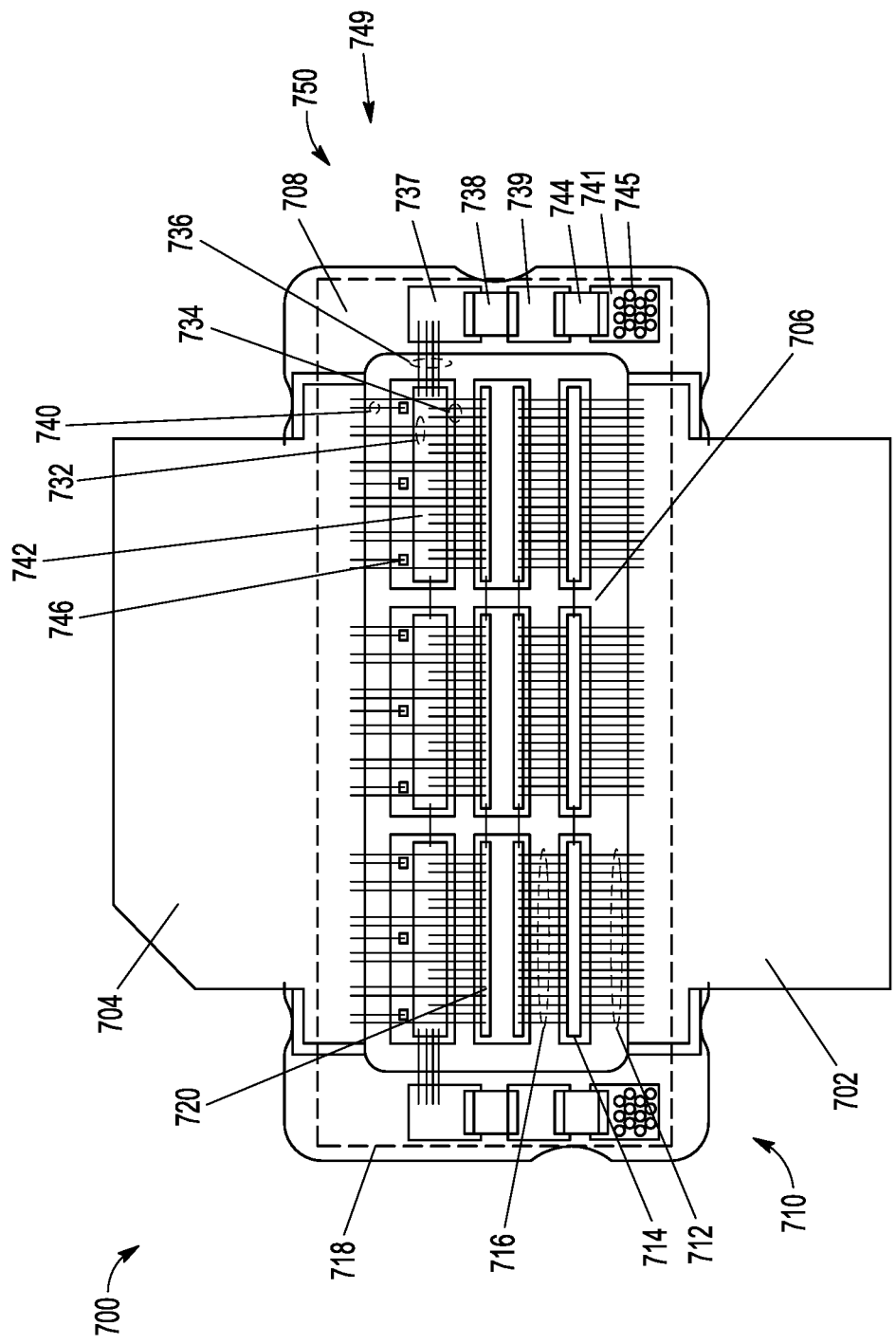
FIG. 7 is a top view of a semiconductor device, in accordance with yet another example embodiment.

FIG. 7 is a top view of a semiconductor device 700, in accordance with yet another example embodiment. The device 700 of FIG. 7 is similar to the devices 300, 600 of FIGS. 3 and 6, in that the device 700 of FIG. 7 also includes an input lead 702 (e.g., input lead 102, FIG. 1), an output lead 704 (e.g., output lead 104, FIG. 1), a flange 706, an isolation structure 708, one or more transistors 720 (e.g., transistor 120, FIG. 1), an input impedance matching circuit 710 (e.g., input impedance matching circuit 110, FIG. 1), an envelope frequency termination circuit 749 (e.g., envelope frequency termination circuit 149, FIG. 1), and an output impedance matching circuit 750 (e.g., output impedance matching circuit 150, FIG. 1), all of which may be packaged together as parts of the device. The input impedance matching circuit 710 includes two inductive elements 712, 716 (e.g., inductive elements 112, 116, FIG. 1) and a capacitor 714 (e.g., capacitor 114, FIG. 1). The output impedance matching circuit 750 includes three inductive elements 732, 734, 740 (e.g., inductors 132, 134, 140, FIG. 1) and two capacitors 742, 746 (e.g., capacitors 142, 146, FIG. 1). The envelope frequency termination circuit 749 includes inductive element 736 (e.g., inductive element 136, FIG. 1), resistor 738 (e.g., resistor 138, FIG. 1), and capacitor 744 (e.g., capacitor 144, FIG. 1). Transistor 720 and various elements 714, 742, 746 of the input and output impedance matching circuits 710, 750 are located on flange 706 within the active device area of device 700. Further, device 700 may be incorporated in an air cavity package with a cap (not shown) having an example perimeter indicated by dashed box 718. In another embodiment, the cap may be sized so that envelope capacitor 744 and envelope resistor 738 are not contained within the air cavity (e.g., inductive element 736 extends through an opening between the cap and the isolation structure 708). In other alternate embodiments, device 700 may be incorporated into an overmolded package.

Similar to the embodiments illustrated in FIGS. 3 and 6, elements of the envelope frequency matching circuit 749 (i.e., envelope resistor 738 and envelope capacitor 744) are located on isolation structure 708 (e.g., on the top surface of isolation structure 708), rather than being located within the active device area. However, the device 700 of FIG. 7 differs from the devices 300, 600 of FIGS. 3 and 6 in that both envelope resistor 738 and envelope capacitor 744 are implemented as surface-mounted, discrete devices (e.g., chip capacitors and discrete resistors) having terminals on opposed ends, which are coupled to (e.g., bonded to, soldered to, and/or adhered to) the top surface of isolation structure 708. In addition, according to an embodiment, device 700 has a different configuration of conductive pads 737, 739, 741 with which the envelope inductive element 736 (e.g., envelope inductor 136, FIG. 1), the envelope resistor 738 (e.g., envelope resistor 138, FIG. 1), and the envelope capacitor 744 (e.g., envelope capacitor 144, FIG. 1) are coupled. Conductive pads 737, 739, 741 each are located on a top surface of isolation structure 708. Conductive pad 737 provides electrical connectivity between envelope inductive element 736 and a first terminal of envelope resistor 738. Conductive pad 739 provides electrical connectivity between a second terminal of envelope resistor 738 and envelope capacitor 744. Finally, conductive pad 741 and conductive vias 745 (and possibly metallization on the bottom surface of flange 708) provide electrical connectivity between envelope capacitor 744 and flange 706.

More particularly, according to an embodiment, envelope inductive element 736 is coupled between the first terminal of capacitor 742 and conductive pad 737. A first terminal of envelope resistor 738 also is coupled to conductive pad 737, and thus an electrical connection between the envelope inductive element 736 and envelope resistor 738 is established through conductive pad 737. A second terminal of envelope resistor 738 is coupled to conductive pad 739. A first terminal of envelope capacitor 744 also is coupled to conductive pad 739, and thus an electrical connection between the envelope resistor 738 and envelope capacitor 744 is established through conductive pad 739. A second terminal of envelope capacitor 744 is coupled to conductive pad 741. In addition, conductive pad 741 (and thus envelope capacitor 744) is electrically coupled to flange 706 through one or more conductive vias 745 (which would actually be hidden, but are shown in FIG. 7 for purposes of clarity) extending between the top and bottom surfaces of isolation structure 708. More specifically, conductive pad 741 is coupled to first ends of vias 745 at the top surface of isolation structure 706, and second ends of vias 745 at the bottom surface of isolation structure 706 are coupled to flange 706 (e.g., through metallization 420, FIG. 4). Accordingly, conductive pad 741 and vias 745 establish an electrical connection between envelope capacitor 744 and flange 706 (e.g., ground). In an alternate embodiment, vias 745 may be replaced by edge plating or castellations, which extend between the top and bottom surfaces of isolation structure 708 along a perimeter edge of isolation structure 708, where the edge plating or castellations provide an electrical connection between conductive pad 741 and flange 706.

Figure 8:
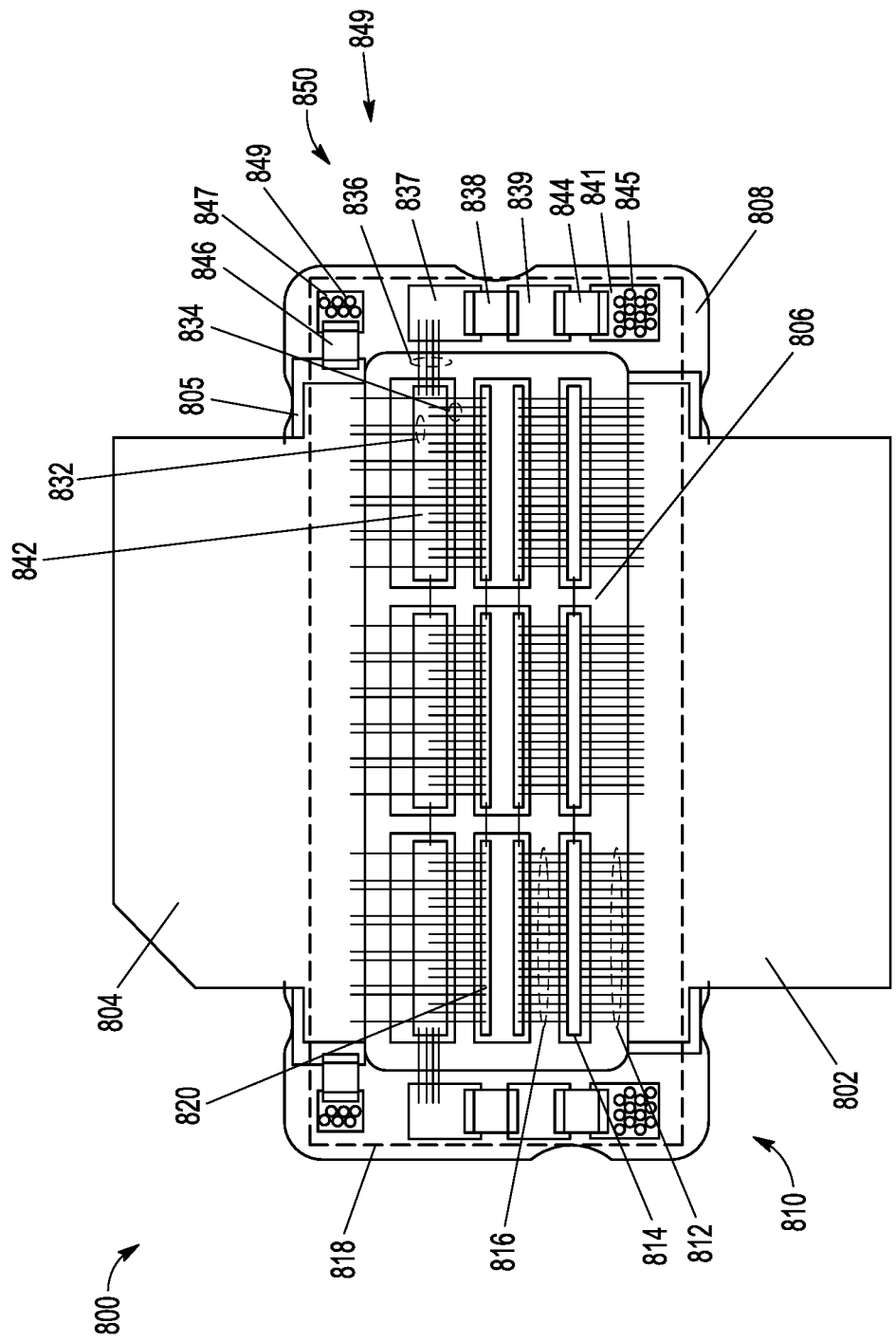
FIG. 8 is a top view of a semiconductor device, in accordance with yet another example embodiment.

As mentioned previously, in addition to elements of an envelope frequency termination circuit (e.g., envelope frequency termination circuit 149, FIG. 1) being positioned outside an active device area, elements of the input and/or output impedance matching circuits (e.g., impedance matching circuits 110, 150, FIG. 1) may be positioned outside of the active device area. For example, FIG. 8 is a top view of a semiconductor device 800, in accordance with yet another example embodiment. In the embodiment of FIG. 8, an element of output impedance matching circuit 850 (i.e., a low-pass matching capacitor 846) is positioned outside of the active device area, in addition to elements of the envelope frequency termination circuit 849. In an alternate embodiment, some or all of the elements of the envelope frequency termination circuit 849 may be positioned within the active device area, while elements of the input and/or output impedance matching circuits 810, 850 may be positioned outside of the active device area. For convenience of explanation, the device 800 of FIG. 8 will be compared with the device of FIG. 7, although it is to be understood that the device 800 of FIG. 8 may have similarities to other, previously-discussed embodiments, as well.

The device 800 of FIG. 8 is similar to the device 700 of FIG. 7, in that the device 800 of FIG. 8 also includes an input lead 802 (e.g., input lead 102, FIG. 1), an output lead 804 (e.g., output lead 104, FIG. 1), a flange 806, an isolation structure 808, one or more transistors 820 (e.g., transistor 120, FIG. 1), an input impedance matching circuit 810 (e.g., input impedance matching circuit 110, FIG. 1), an envelope frequency termination circuit 849 (e.g., envelope frequency termination circuit 149, FIG. 1), and an output impedance matching circuit 850 (e.g., output impedance matching circuit 150, FIG. 1), all of which may be packaged together as parts of the device. The input impedance matching circuit 810 includes two inductive elements 812, 816 (e.g., inductive elements 112, 116, FIG. 1) and a capacitor 814 (e.g., capacitor 114, FIG. 1). In contrast to the device 700 of FIG. 7, and for reasons that will be explained in more detail below, the output impedance matching circuit 850 includes only two (rather than three) inductive elements 832, 834 (e.g., inductors 132, 134, FIG. 1) and two capacitors 842, 846 (e.g., capacitors 142, 146, FIG. 1). The envelope frequency termination circuit 849 includes inductive element 836 (e.g., inductive element 136, FIG. 1), resistor 838 (e.g., resistor 138, FIG. 1), and capacitor 844 (e.g., capacitor 144, FIG. 1). Transistor 820 and various elements 814, 842, of the input and output impedance matching circuits 810, 850 are located on flange 806 within the active device area of device 800. Further, device 800 may be incorporated in an air cavity package with a cap (not shown) having an example perimeter indicated by dashed box 818. In another embodiment, the cap may be sized so that envelope capacitor 844, envelope resistor 838, and/or low-pass matching capacitor 846 are not contained within the air cavity. In other alternate embodiments, device 800 may be incorporated into an overmolded package.

Also similar to the embodiment illustrated in FIG. 7, elements of the envelope frequency matching circuit 849 (i.e., envelope resistor 838 and envelope capacitor 844) are located on isolation structure 808 (e.g., on the top surface of isolation structure 808), rather than being located within the active device area. In addition, device 800 includes a configuration of conductive pads 837, 839, 841 and vias 845 with which the envelope inductive element 836 (e.g., envelope inductor 136, FIG. 1), the envelope resistor 838 (e.g., envelope resistor 138, FIG. 1), and the envelope capacitor 844 (e.g., envelope capacitor 144, FIG. 1) are coupled, as described previously in conjunction with FIG. 7. Although FIG. 8 corresponds to an embodiment in which both envelope resistor 838 and envelope capacitor 844 are implemented as surface-mounted, discrete devices having terminals on opposed ends, envelope resistor 838 and envelope capacitor 844 may have different configurations, as well. For example, envelope resistor 838 may be implemented as a thin or thick film resistor (e.g., as in the embodiments of FIGS. 3 and 6), and/or envelope capacitor 844 may be implemented as a multiple-layer capacitor that is integrated with the isolation structure 808 (e.g., as in the embodiment of FIG. 3).

In contrast with the embodiment of FIG. 7, an element of the output impedance matching circuit 850 (i.e., low-pass matching capacitor 846) is located outside the active device area. As illustrated in FIG. 8, low-pass matching capacitor 846 may be a discrete capacitor, which is coupled to (e.g., bonded to, soldered to, and/or adhered to) the top surface of isolation structure 808. Alternatively, low-pass matching capacitor 846 may be implemented as a multi-layer capacitor that is integrated with isolation structure 808 (e.g., in a manner similar to envelope capacitor 344, FIG. 3). In an embodiment in which low-pass matching capacitor 846 is a discrete capacitor (e.g., the embodiment of FIG. 8), the metallization 805 to which output lead 804 is attached is configured so that a first terminal of low-pass matching capacitor 846 may be coupled to the metallization 805, so that the metallization 805 establishes an electrical connection between output lead 804 and low-pass matching capacitor 846. Metallization 805 may be considered to be a conductive pad to which the output lead 804 and the capacitor 846 are coupled. The electrical connection provided by metallization 805 replaces the electrical connection provided by inductive element 740 in FIG. 7 (e.g., inductive element 140, FIG. 4). Accordingly, in the embodiment of FIG. 8, the low-pass matching inductor (e.g., inductive element 140, FIG. 4) may be eliminated from the output impedance matching circuit 850 (e.g., output impedance matching circuit 150, FIG. 1). Elimination of the low-pass matching inductor is advantageous, in that its effect on the output impedance matching circuit does not need to be compensated for, and the issue of inductive coupling between the low-pass matching inductor and other inductors in the system (e.g., series inductor 132, FIG. 1) is eliminated. In addition, undesired losses in the output circuit, which may otherwise be experienced due to the inclusion of a low-pass matching inductive element (e.g., low-pass matching inductor 140, FIG. 1), are eliminated in the embodiment of FIG. 8. Further, the impedance transformation achievable by the output impedance matching circuit 850 may be better than impedance transformations achievable in circuits that include a low-pass matching inductive element.

In addition, device 800 has an additional conductive pad 847 to which the second terminal of low-pass matching capacitor 846 is coupled. The conductive pad 847, in turn, is electrically coupled to flange 806 through one or more conductive vias 849 (which would actually be hidden, but are shown in FIG. 8 for purposes of clarity) extending between the top and bottom surfaces of isolation structure 808. Accordingly, conductive pad 847 and conductive vias 849 (and possibly metallization on the bottom surface of flange 808) provide electrical connectivity between low-pass matching capacitor 846 and flange 806. In an alternate embodiment, vias 849 may be replaced by edge plating or castellations, which extend between the top and bottom surfaces of isolation structure 808 along a perimeter edge of isolation structure 808, where the edge plating or castellations provide an electrical connection between conductive pad 847 and flange 806.

Each of the previously-discussed and illustrated embodiments corresponds to a two-lead device (e.g., devices having an input lead 104 and an output lead 106, FIG. 1). Such a device may be incorporated into a larger electrical system by physically coupling the device to a PCB, electrically connecting the input lead to a signal source, and electrically connecting the output lead to a load. The PCB may further include one or more bias feeds (e.g., each with a length of lambda/4 or some other length) with proximal ends located close to the PCB connection(s) to the output lead and/or input lead. A blocking capacitor at the distal end of each bias lead may provide a short at a given RF frequency, which when transformed through the bias lead, appears as an open circuit.

Other embodiments include devices with bias leads formed as integral portions of the device, and additional conductive features that coupled the bias leads with the impedance matching network(s). For example, another embodiment includes a four-lead device (e.g., device 900, FIG. 9), in which two bias leads (e.g., bias leads 937, FIG. 9) are coupled to the output impedance matching circuit (e.g., output impedance matching circuit 150, FIG. 1). Another embodiment (not illustrated) may include a four-lead device with two bias leads coupled to the input impedance matching circuit (e.g., input impedance matching circuit 110, FIG. 1). Yet another embodiment (not illustrated) includes a six-lead device with two bias leads coupled to the output impedance matching circuit and two bias leads coupled to the input impedance matching circuit. In still other embodiments, only a single bias lead may be coupled to the input and/or output impedance matching circuits (e.g., particularly for embodiments in which there are more than two RF leads, such as in dual-path and multi-path devices).

In addition, several of the previously-discussed embodiments include certain output impedance matching circuit elements located on (and/or integrated with) an isolation structure (e.g., isolation structures 308, 608, 708, 808, FIGS. 3 and 6-8). As discussed, the isolation structures may be inorganic (e.g., ceramic) or organic (e.g., implemented using PCB materials). According to some embodiments in which the isolation structure includes materials with a suitable dielectric constant (e.g., in a range from about 3.0 to about 10.0, although materials with higher or lower dielectric constants may be used), the low-pass matching capacitors (e.g., low-pass matching capacitors 146, 246, 346, 646, 746, 846, FIGS. 1-3 and 6-8) may be replaced with a distributed capacitance under the output lead, as will be discussed in more detail in conjunction with FIGS. 9-11. This replacement of the low-pass matching capacitor with a distributed capacitance under the output lead may be applied to any of the previously-discussed embodiments.

Figure 9:
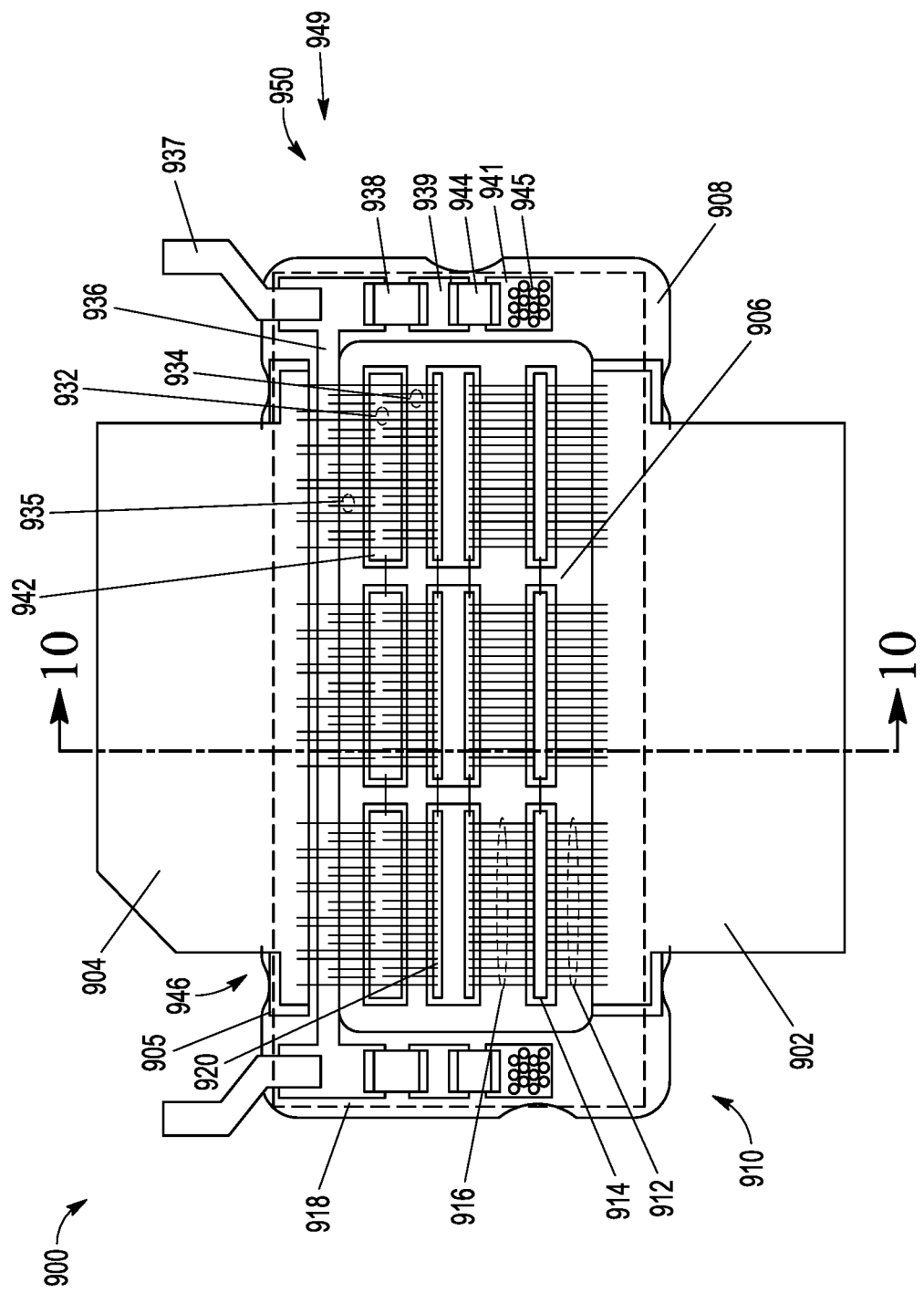
FIG. 9 is a top view of a four-lead semiconductor device, in accordance with yet another example embodiment.
Figure 10:
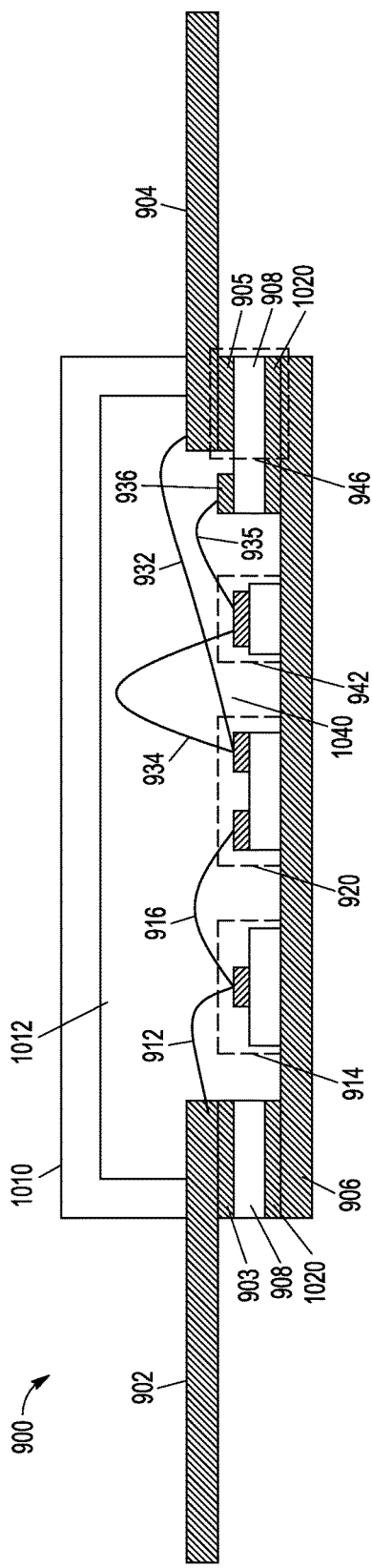
FIG. 10 is a cross-sectional, side view of the semiconductor device of FIG. 9 along line 10-10.

For example, FIG. 9 is a top view of a four-lead semiconductor device 900, in accordance with yet another example embodiment. For enhanced understanding, FIG. 9 should be viewed in conjunction with FIG. 10, which is a cross-sectional, side view of the semiconductor device of FIG. 9 along line 10-10. More specifically, FIG. 10 is a cross-sectional view through input and output leads 902, 904 and the active device area. FIG. 10 also illustrates a cap 1010, which may be implemented in air cavity package embodiments, and which is configured to seal the interior components of device 900 within an air cavity 1012. In contrast with the previously-discussed embodiments, device 900 includes two additional bias leads 937 and a distributed low-pass capacitance 946 under the output lead 904 (rather than a discrete, low-pass matching capacitor, such as low-pass matching capacitors 246, 346, 646, 746, 846, FIGS. 2, 3, and 6-8), as will be discussed in more detail below. For convenience of explanation, the device 900 of FIG. 9 will be compared with the device of FIG. 7, although it is to be understood that the device 900 of FIG. 9 may have similarities to other, previously-discussed embodiments, as well.

The device 900 of FIG. 9 is similar to the device 700 of FIG. 7, in that the device 900 of FIG. 9 also includes an input lead 902 (e.g., input lead 102, FIG. 1), an output lead 904 (e.g., output lead 104, FIG. 1), a flange 906, an isolation structure 908, one or more transistors 920 (e.g., transistor 120, FIG. 1), an input impedance matching circuit 910 (e.g., input impedance matching circuit 110, FIG. 1), an envelope frequency termination circuit 949 (e.g., envelope frequency termination circuit 149, FIG. 1), and an output impedance matching circuit 950 (e.g., output impedance matching circuit 150, FIG. 1), all of which may be packaged together as parts of the device. The input impedance matching circuit 910 includes two inductive elements 912, 916 (e.g., inductive elements 112, 116, FIG. 1) and a capacitor 914 (e.g., capacitor 114, FIG. 1). The output impedance matching circuit 950 includes inductive elements 932, 934 (e.g., inductors 132, 134, FIG. 1) and two capacitors 942, 946 (e.g., capacitors 142, 146, FIG. 1). The envelope frequency termination circuit 949 includes inductive elements 935, 936 (e.g., inductive element 136, FIG. 1), resistor 938 (e.g., resistor 138, FIG. 1), and capacitor 944 (e.g., capacitor 144, FIG. 1).

Inductive elements 935 and 936, which together form the envelope inductor (e.g., envelope inductor 136, FIG. 1) are coupled in series between shunt capacitor 942 and envelope resistor 938, and essentially replace inductive element 736. While inductive elements 935 and 936 may be functionally similar to inductive element 736 (e.g., the range of inductances are similar), their physical implementation is different. More particularly, inductive element 936 includes metallization on a top surface of isolation structure 908, rather than being implemented as a series of bondwires, as is the case for inductive element 736. A first portion of the metallization forming inductive element 936 (referred to herein as a "bar portion" of inductive element 936) is located on a portion of isolation structure 908 that extends toward the active device area beyond the edge of output lead 904. More particularly, the bar portion of inductive element 936 extends adjacent to and in parallel with the edge of output lead 904, and the bar portion of inductive element 936 is electrically isolated from the output lead 904. The length (horizontal dimension, in FIG. 9) of the bar portion of inductive element 936 is greater than the length of the edge of output lead 904, in an embodiment. Second portions of the metallization forming inductive element 936 (referred to herein as "conductive pad portions" of inductive element 936) are located at opposed ends of the bar portion, and are shaped to facilitate electrical connection with envelope resistors 938 and bias leads 937. Inductive element 935 (i.e., formed from a plurality of bondwires) is electrically coupled between shunt capacitor 942 and the bar portion of inductive element 936. Accordingly, inductive elements 935 and 936 represent a set of series-coupled inductors between shunt capacitor 942 and envelope resistor 938.

According to an embodiment, inductive elements 935, 936 correspond to the RF cold point (e.g., node 148, FIG. 1) of the device 900. The proximal end of a bias lead 937 is coupled to each of the conductive pad portions of inductive element 936. The bias leads 937 extend from the device 900, once packaged, so that their distal ends are exposed and may be coupled to a PCB of a larger system to receive a bias voltage. Accordingly, inclusion of bias leads 937 eliminates the need for bias leads on the PCB itself. According to an embodiment, each bias lead 937 has a length corresponding to lambda/4, although each bias lead 937 may have a different length, as well.

As with the device 700 depicted in FIG. 7, transistor 920 and various elements 914, 942, of the input and output impedance matching circuits 910, 950 are located on flange 906 within the active device area of device 900. Further, device 900 may be incorporated in an air cavity package with a cap (not shown) having an example perimeter indicated by dashed box 918. In another embodiment, the cap may be sized so that envelope capacitor 944, envelope resistor 938, and/or inductive element 936 are not contained within the air cavity. In other alternate embodiments, device 900 may be incorporated into an overmolded package (e.g., as in the embodiment of FIG. 11, described later).

Also similar to the embodiment illustrated in FIG. 7, elements of the envelope frequency matching circuit 949 (i.e., envelope resistor 938 and envelope capacitor 944) are located on isolation structure 908 (e.g., on the top surface of isolation structure 908), rather than being located within the active device area. In addition, device 900 includes a configuration of conductive pads 939, 941 and vias 945 with which the envelope inductive element 936 (e.g., envelope inductor 136, FIG. 1), the envelope resistor 938 (e.g., envelope resistor 138, FIG. 1), and the envelope capacitor 944 (e.g., envelope capacitor 144, FIG. 1) are coupled, as described previously in conjunction with FIG. 7.

In contrast with the embodiment of FIG. 7, however, one terminal of envelope resistor 938 is coupled with the conductive pad portion of inductive element 936, rather than being coupled through a conductive pad (i.e., conductive pad 737) to an inductive element (e.g., inductive element 736) consisting of bondwires. Although FIG. 9 corresponds to an embodiment in which both envelope resistor 938 and envelope capacitor 944 are implemented as surface-mounted, discrete devices having terminals on opposed ends, envelope resistor 938 and envelope capacitor 944 may have different configurations, as well. For example, envelope resistor 938 may be implemented as a thin or thick film resistor (e.g., as in the embodiments of FIGS. 3 and 6), and/or envelope capacitor 944 may be implemented as a multiple-layer capacitor that is integrated with the isolation structure 908 (e.g., as in the embodiment of FIG. 3).

Also in contrast with the embodiment of FIG. 7, an element of the output impedance matching circuit 950 (i.e., low-pass matching capacitor 946) is located outside the active device area. More particularly, in the embodiment of FIG. 9, low-pass matching capacitor 946 is implemented as a capacitance that is distributed under the output lead 904. Referring to FIG. 10, low-pass matching capacitor 946 consists of the metallization 905 under output lead 904 (e.g., defining a top plate of low-pass matching capacitor 946), a portion of isolation structure 908 under output lead 904 (e.g., defining a dielectric layer of low-pass matching capacitor 946, when at least that portion of isolation structure 908 is formed from a rigid, low-loss, organic or inorganic material), and metallization 1020 on the bottom surface of output lead 904 (e.g., defining the bottom plate of low-pass matching capacitor 946). If metallization 905 and/or metallization 1020 are not included, then the output lead 904 and/or flange 906 may function as the top and/or bottom plates of low-pass matching capacitor 946). The capacitance of low-pass matching capacitor 946 is defined by the overlapping portions of output lead 904 and flange 906, and the dielectric constant and height of the portion of the isolation structure 908 between the overlapping portions of the output lead 904 and flange 906. Accordingly, these parameters are defined to achieve a desired capacitance for low-pass matching capacitor 946 (e.g., a capacitance in a range from about 1 pF to about 50 pF).

As with the embodiment described in conjunction with FIG. 8, the configuration of the low-pass matching capacitor 946 in FIG. 9 allows for the elimination of inductive element 740 in FIG. 7 (e.g., inductive element 140, FIG. 4) from the output impedance matching circuit 950 (e.g., output impedance matching circuit 150, FIG. 1). As discussed previously in conjunction with FIG. 8, elimination of the low-pass matching inductor is advantageous, in that its effect on the output impedance matching circuit does not need to be compensated for, and the issue of inductive coupling between the low-pass matching inductor and other inductors in the system (e.g., series inductor 132, FIG. 1) is eliminated.

In addition, as discussed previously in conjunction with FIGS. 3 and 4, the inductive coupling between bondwires 932 and 934 is related to the area 1040 underneath both sets of bondwires 932, 934. By eliminating bondwires corresponding to the low-pass matching inductor (e.g., bondwires 340, FIG. 3), the height and length of bondwires 932 may be shortened, thus reducing the area 1040 under bondwires 932, 934. Accordingly, the inductive coupling between bondwires 932, 934 may be reduced, when compared with embodiments that include bondwires associated with a low-pass matching inductor (e.g., the embodiments of FIGS. 3, 6, and 7).

Figure 11:
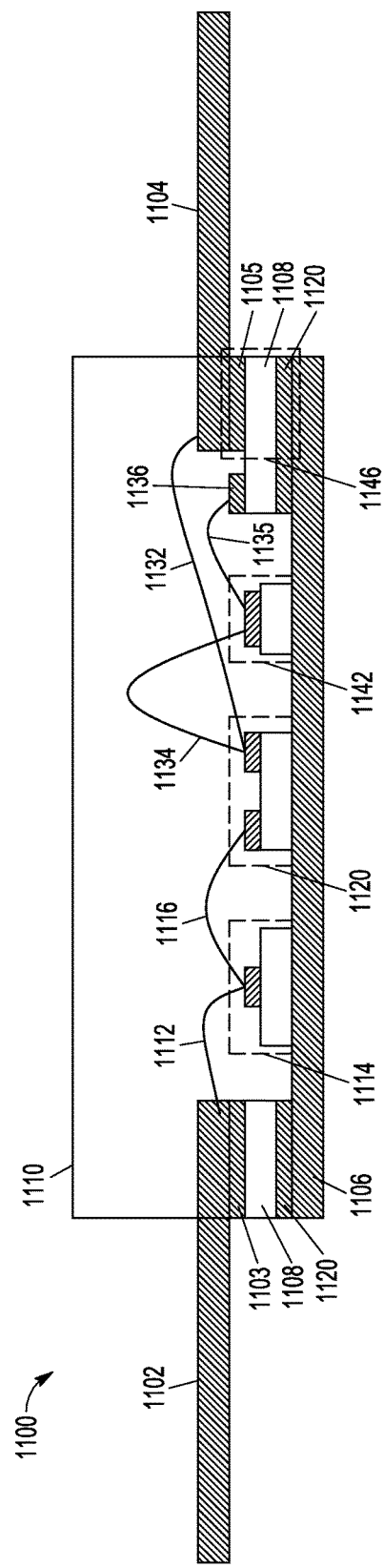
FIG. 11 is a cross-sectional, side view of a semiconductor device, in accordance with yet another example embodiment.

The figures corresponding to the previously-described embodiments correspond to implementations of air cavity packages. However, as indicated above, any of the various embodiments alternatively could be implemented in an overmolded package. For example, FIG. 11 is a cross-sectional, side view of a semiconductor device 1100 that is implemented in an overmolded package, in accordance with yet another example embodiment. The cross-section of FIG. 11 corresponds to a cross-section taken through input and output leads 1102, 1104 and an active device area (e.g., similar to the cross-section of FIG. 10).

The embodiment illustrated in FIG. 11 is substantially the same as the embodiment illustrated in FIGS. 9 and 10, in that device 1100 also includes an input lead 1102 (e.g., input lead 102, FIG. 1), an output lead 1104 (e.g., output lead 104, FIG. 1), a flange 1106, an isolation structure 1108, one or more transistors 1120 (e.g., transistor 120, FIG. 1), an input impedance matching circuit (e.g., including two inductive elements 1112, 1116 (e.g., inductive elements 112, 116, FIG. 1) and a capacitor 1114 (e.g., capacitor 114, FIG. 1)), an envelope frequency termination circuit (e.g., including an inductive element 1136 (e.g., inductor 136, FIG. 1), a resistor (e.g., resistor 138, FIG. 1, not shown), and a capacitor (e.g., capacitor 144, FIG. 1, not shown)), and an output impedance matching circuit (e.g., including inductive elements 1132, 1134, 1135 (e.g., inductors 132, 134, FIG. 1) and two capacitors 1142, 1146 (e.g., capacitors 142, 146, FIG. 1). As with the embodiment of FIGS. 9 and 10, a low-pass matching capacitor 1146 is formed under output lead 1104 from metallization 1105 (and/or output lead 1104), isolation structure 1108, and metallization 1120 (and/or flange 1106). In addition, inductive element 1136 may have a bar portion, which is coupled (e.g., through conductive pad portions, not shown, of inductive element 1136) to envelope resistors (e.g., envelope resistor 938, FIG. 9) and/or to bias leads (e.g., bias leads 937, FIG. 9).

The difference between device 1100 and device 900 is that, rather than including a cap (e.g., cap 1010) that defines an air cavity (e.g., air cavity 1012), device 900 includes non-conductive molding compound 1110, which is configured to encompass the components and circuit elements within the active device area. In addition, in an embodiment, the mold compound 1110 may encompass portions of leads 1102, 1104, all or portions of the isolation structure 1108, and some or all of the other elements of the input and output matching circuits and envelope frequency termination circuit, whether or not they are located within the active device area. In alternate embodiments, the mold compound 1110 may not encompass some or all of the elements that are located outside of the active device area. It is to be understood that any of the embodiments illustrated in FIGS. 2-10 may be implemented in an overmolded package similar to that of FIG. 11, rather than being implemented in air cavity packages.

Figure 12:
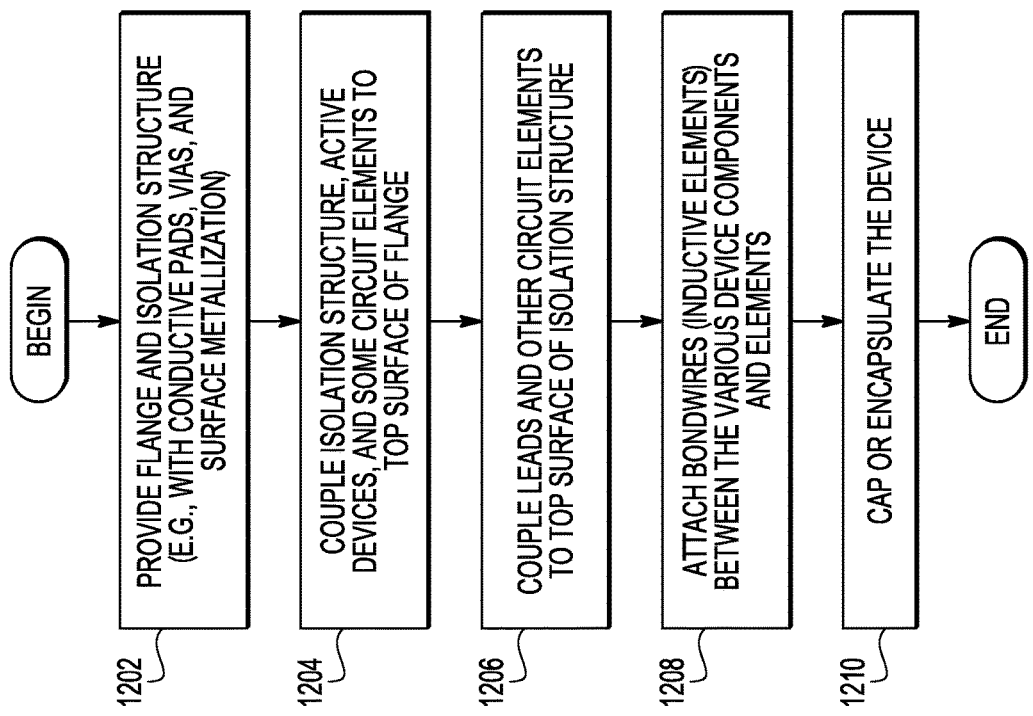
FIG. 12 is a flowchart of a method of manufacturing a semiconductor device, in accordance with an example embodiment.

FIG. 12 is a flowchart of a method of manufacturing a semiconductor device (e.g., devices 300, 600, 700, 800, 900, 1100, FIGS. 3-11), in accordance with various example embodiments. The method may begin, in block 1202, by providing a flange (e.g., flange 306, 606, 706, 806, 906, 1106) and an isolation structure (e.g., isolation structure 308, 608, 708, 808, 908, 1108). In accordance with various embodiments discussed previously, the isolation structure may include a combination of conductive pads, vias (or castellations or edge plating), and surface metallization, which facilitate physical and electrical coupling of certain elements of the input and/or output impedance matching networks to the isolation structure. In addition, in some embodiments, the isolation structure may include one or more integrated capacitors (e.g., capacitors 344). In some other embodiments (e.g., the embodiments illustrated in FIGS. 9-11), the isolation structure may include metallization on its top surface corresponding to bar and conductive pad portions of an inductive element (e.g., inductive element 936, 1136).

In block 1204, the isolation structure is coupled (e.g., soldered, glued, or otherwise adhered) to the top surface of the flange. In addition, active devices (e.g., transistors 320, 620, 720, 820, 920, 1120) and some circuit elements (e.g., capacitors 314, 614, 714, 814, 914, 1114, capacitors 342, 642, 742, 842, 942, 1142, and capacitors 346, 646, 746) are coupled to a portion of the top surface of the flange that is exposed through an opening in the isolation structure (e.g., the active device area).

In block 1206, leads (e.g., input leads 302, 602, 702, 802, 902, 1102, output leads 304, 604, 704, 804, 904, 1104, and bias leads 937) are coupled to the top surface of the isolation structure (e.g., to metallization on the top surface of the isolation structure). In an alternate embodiment, a conductive layer on the top surface of the isolation structure may be patterned and etched to form a leadframe (e.g., prior to coupling the isolation structure to the flange). As used herein, references to "coupling" a lead to the isolation structure mean that a lead is separately formed and then coupled to the isolation structure, or that the lead is formed on the isolation structure (e.g., by patterning and etching a conductive layer on a surface of the isolation structure). In addition, other circuit elements (e.g., resistors 338, 638, 738, 838, 938, capacitors 644, 744, 844, 846, 944) are coupled to (e.g., bonded to, soldered to, and/or adhered to) the top surface of the isolation structure (e.g., to conductive pads or other metallization on the top surface of the isolation structure). The other circuit elements may be coupled to the isolation structure before or after the isolation structure is coupled to the flange.

In block 1208, bondwires that form inductive elements (e.g., inductive elements 312, 316, 332, 334, 336, 340, 612, 614, 632, 634, 636, 640, 712, 714, 732, 734, 736, 740, 812, 814, 832, 834, 836, 912, 914, 932, 934, 935) are attached between the various device components and elements. Finally, in block 1210, the device is capped (e.g., with cap 410, 1010) or encapsulated (e.g., with mold compound 1110). The device may then be incorporated into a larger electrical system.

It is to be understood that the various steps discussed in conjunction with FIG. 12 may be performed in orders other than the order depicted in FIG. 12. For example, as indicated above, input and output leads (or a leadframe) and/or various circuit elements (i.e., circuit elements to be located outside the active device area) may be formed on or coupled to an isolation structure before the isolation structure is coupled to the flange, in various embodiments. In other words, an isolation structure subassembly (e.g., including leads and/or circuit elements) may be constructed, and subsequently coupled to the flange, in an embodiment, rather than first coupling the isolation structure to the flange, and subsequently coupling the leads and/or circuit elements to the isolation structure. Other modifications to the order of steps depicted in FIG. 12 also could be made, and such modifications are intended to be included within the scope of the inventive subject matter.

Various embodiments of semiconductor devices (e.g., RF transistor devices) and methods of their manufacture have been described above. An embodiment of a device includes a substrate, an isolation structure, an active device, a lead, and a circuit. The isolation structure has a top surface, a bottom surface coupled to a surface of the substrate, and an opening, and the lead is coupled to the isolation structure. An active device area is defined by a portion of the surface of the substrate that is exposed through the opening. The active device is coupled to the surface of the substrate within the active device area. The circuit is electrically coupled between the active device and the lead. The circuit includes a plurality of elements, and one or more elements of the plurality of elements is positioned outside the active device area. According to a further embodiment, the one or more elements positioned outside the active device area are physically coupled to the isolation structure. According to another further embodiment, the one or more elements positioned outside the active device area include one or more elements of an envelope termination circuit.

Another embodiment of a device includes a substrate, an isolation structure, a transistor, a lead, and a circuit. The substrate has a conductive surface, and the isolation structure has a top surface and a bottom surface coupled to the conductive surface of the substrate. The isolation structure includes an opening, and an active device area is defined by a portion of the conductive surface of the substrate that is exposed through the opening. The transistor is coupled to the conductive surface of the substrate within the active device area. The lead is coupled to the isolation structure. The circuit is electrically coupled between the transistor and the lead. The circuit includes a plurality of elements, and one or more elements of the plurality of elements is positioned outside the active device area. According to a further embodiment, the lead is an output lead, the circuit is an output circuit coupled between a current conducting terminal of the transistor and the output lead, and the one or more elements positioned outside the active device area are physically coupled to the isolation structure. According to another further embodiment, the device also includes one or more conductive pads and/or one or more conductive structures in or on the isolation structure, which electrically couple to the one or more elements positioned outside the active device area. The one or more conductive structures may be selected from one or more vias, one or more castellations, and edge plating.

Another embodiment of a device includes a substrate, a lead, an isolation structure, an active device, and a circuit. The isolation structure has a top surface and a bottom surface. The lead is coupled to the top surface of the isolation structure, and the bottom surface of the isolation structure is coupled to a surface of the substrate. An active device area corresponds to a portion of the surface of the substrate to which the isolation structure is not coupled. The active device is coupled to the surface of the substrate within the active device area. The circuit is electrically coupled between the active device and the lead. The circuit includes a plurality of elements. One or more elements of the plurality of elements is positioned outside the active device area. The one or more elements positioned outside the active device area includes a capacitor under the lead, which includes a portion of the isolation structure between the lead and the substrate. According to a further embodiment, the device also includes molding compound that encompasses the active device and elements of the circuit at least within the active device area. According to another further embodiment, the capacitor is a low-pass matching capacitor. According to yet another further embodiment, the isolation structure is formed from printed circuit board materials. According to yet another further embodiment, the one or more elements positioned outside the active device area also include one or more passive devices (e.g., capacitors and/or resistors) coupled to a top surface of the isolation structure and/or integrated within the isolation structure.

An embodiment of a method of manufacturing a semiconductor device includes the steps of providing a substrate, and coupling a bottom surface of an isolation structure to a surface of the substrate. The isolation structure includes an opening, and an active device area is defined by a portion of the surface of the substrate that is exposed through the opening. The method further includes coupling an active device to the surface of the substrate within the active device area, coupling a lead to the isolation structure, and electrically coupling a circuit between the active device and the lead. The circuit includes a plurality of elements, and one or more elements of the plurality of elements is positioned outside the active device area. According to a further embodiment, the one or more elements positioned outside the active device area are physically coupled to the isolation structure.

The connecting lines shown in the various figures contained herein are intended to represent exemplary functional relationships and/or physical couplings between the various elements. It should be noted that many alternative or additional functional relationships or physical connections may be present in an embodiment of the subject matter. In addition, certain terminology may also be used herein for the purpose of reference only, and thus are not intended to be limiting, and the terms "first", "second" and other such numerical terms referring to structures do not imply a sequence or order unless clearly indicated by the context.

As used herein, a "node" means any internal or external reference point, connection point, junction, signal line, conductive element, or the like, at which a given signal, logic level, voltage, data pattern, current, or quantity is present. Furthermore, two or more nodes may be realized by one physical element (and two or more signals can be multiplexed, modulated, or otherwise distinguished even though received or output at a common node).

The foregoing description refers to elements or nodes or features being "connected" or "coupled" together. As used herein, unless expressly stated otherwise, "connected" means that one element is directly joined to (or directly communicates with) another element, and not necessarily mechanically. Likewise, unless expressly stated otherwise, "coupled" means that one element is directly or indirectly joined to (or directly or indirectly communicates with, electrically or otherwise) another element, and not necessarily mechanically. Thus, although the schematic shown in the figures depict one exemplary arrangement of elements, additional intervening elements, devices, features, or components may be present in an embodiment of the depicted subject matter.

While at least one exemplary embodiment has been presented in the foregoing detailed description, it should be appreciated that a vast number of variations exist. It should also be appreciated that the exemplary embodiment or embodiments described herein are not intended to limit the scope, applicability, or configuration of the claimed subject matter in any way. Rather, the foregoing detailed description will provide those skilled in the art with a convenient road map for implementing the described embodiment or embodiments. It should be understood that various changes can be made in the function and arrangement of elements without departing from the scope defined by the claims, which includes known equivalents and foreseeable equivalents at the time of filing this patent application.

What is claimed is:

1. A device comprising:
   a substrate having a surface;
   a lead;
   an isolation structure having a top surface and a bottom surface, wherein the lead is coupled to the top surface of the isolation structure, and the bottom surface of the isolation structure is coupled to the surface of the substrate, and wherein an active device area corresponds to a portion of the surface of the substrate to which the isolation structure is not coupled;
   an active device coupled to the surface of the substrate within the active device area; and
   a circuit electrically coupled between the active device and the lead, wherein the circuit includes a plurality of elements, wherein one or more elements of the plurality of elements is positioned outside the active device area, and wherein the one or more elements positioned outside the active device area includes a first capacitor under the lead and comprising a portion of the isolation structure between the lead and the substrate, and wherein the circuit further includes a first inductive element coupled between the active device and the lead and a shunt circuit coupled between the active device and the substrate.

2. The device of claim 1, further comprising:
   metallization between the lead and the isolation structure, wherein the metallization functions as a plate of the first capacitor.

3. The device of claim 1, further comprising:
   metallization between the substrate and the isolation structure, wherein the metallization functions as a plate of the first capacitor.

4. The device of claim 1, wherein the capacitor is a low-pass matching capacitor.

5. The device of claim 1, wherein the shunt circuit comprises:
   a shunt capacitor coupled to the surface of the substrate in the active device area, wherein the shunt capacitor is positioned between the active device and the isolation structure.

6. The device of claim 1, wherein the isolation structure is formed from one or more materials selected from ceramic, aluminum oxide, aluminum nitride, a polymer, and printed circuit board materials.

7. The device of claim 1, wherein the one or more elements positioned outside the active device area also include one or more passive devices directly coupled to a top surface of the isolation structure.

8. The device of claim 1, wherein the shunt circuit comprises:
   a shunt capacitor coupled to the substrate between the active device and the isolation structure; and
   a second inductive element coupled between the active device and the shunt capacitor.

9. The device of claim 1, wherein:
the first inductive element comprises a first plurality of bondwires; and
the second inductive element comprises a second plurality of bondwires.

10. A device comprising:
a substrate having a surface;
a lead;
an isolation structure having a top surface and a bottom surface, wherein the lead is coupled to the top surface of the isolation structure, and the bottom surface of the isolation structure is coupled to the surface of the substrate, and wherein an active device area corresponds to a portion of the surface of the substrate to which the isolation structure is not coupled;
an active device coupled to the surface of the substrate within the active device area; and
a circuit electrically coupled between the active device and the lead, wherein the circuit includes a plurality of elements, wherein one or more elements of the plurality of elements is positioned outside the active device area, and wherein the one or more elements positioned outside the active device area includes a first capacitor under the lead and comprising a portion of the isolation structure between the lead and the substrate, and wherein the circuit further includes a shunt circuit coupled between the active device and the substrate, and an envelope termination circuit coupled between the shunt circuit and the substrate, wherein the one or more elements positioned outside the active device area also include one or more elements of the envelope termination circuit.

11. The device of claim 10, wherein the at least some of the elements of the envelope termination circuit are physically coupled to the isolation structure.

12. The device of claim 10, wherein the envelope termination circuit comprises:
an inductive element;
a resistor; and
a second capacitor, wherein the inductive element, the resistor, and the second capacitor are coupled in series between the shunt circuit and the substrate.

13. The device of claim 12, wherein the inductive element comprises a plurality of bondwires coupled between the shunt circuit and the resistor.

14. The device of claim 12, wherein the inductive element comprises metallization located on the isolation structure.

15. The device of claim 1, wherein the device is implemented in an air-cavity package, and the device further comprises:
a cap that defines an air cavity in which the active device is located.

16. The device of claim 1, wherein the device is implemented in an overmolded package, and the device further comprises:
molding compound that encompasses the active device and elements of the circuit at least within the active device area.

* * * * *